(12) United States Patent
Ryu et al.

(10) Patent No.: US 11,711,961 B2
(45) Date of Patent: *Jul. 25, 2023

(54) FINGERPRINT SENSOR AND DISPLAY DEVICE INCLUDING THE SAME

(71) Applicant: SAMSUNG DISPLAY CO., LTD., Yongin-si (KR)

(72) Inventors: Ji Hun Ryu, Yongin-si (KR); Jin Oh Kwag, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/732,252

(22) Filed: Apr. 28, 2022

(65) Prior Publication Data

US 2022/0254844 A1 Aug. 11, 2022

Related U.S. Application Data

(63) Continuation of application No. 16/875,185, filed on May 15, 2020, now Pat. No. 11,322,557.

(30) Foreign Application Priority Data

May 28, 2019 (KR) .................. 10-2019-0062644

(51) Int. Cl.
*G09G 5/00* (2006.01)
*H10K 59/60* (2023.01)
*G06F 3/041* (2006.01)
*G06V 40/13* (2022.01)
(Continued)

(52) U.S. Cl.
CPC ........... *H10K 59/60* (2023.02); *G06F 3/0412* (2013.01); *G06V 40/1318* (2022.01);
(Continued)

(58) Field of Classification Search
CPC ............ H01L 27/3227; H01L 27/3213; H01L 27/3246; H01L 51/5284; H01L 27/3218;
(Continued)

(56) References Cited

U.S. PATENT DOCUMENTS 9,225,888 B2 12/2015 Huang
2004/0135952 A1* 7/2004 Kurashina ......... G02F 1/136227
349/110

(Continued)

FOREIGN PATENT DOCUMENTS

KR 10-2019-0011280 A 2/2019
KR 10-2019-0028245 A 3/2019

*Primary Examiner* — Thuy N Pardo
(74) *Attorney, Agent, or Firm* — Lewis Roca Rothgerber Christie LLP

(57) ABSTRACT

A fingerprint sensor includes: a substrate; a circuit element layer on a first surface of the substrate and including a plurality of conductive layers; a light emitting element layer on the circuit element layer and including light emitting elements and a light shielding layer; and a light sensor layer on a second surface of the substrate and including light sensors, wherein the light shielding layer includes contact holes exposing first electrodes of the light emitting elements, and first opening portions exposing a portion of the circuit element layer, and the circuit element layer includes second opening portions formed in the plurality of conductive layers and includes a light transmission hole of which at least a portion overlaps the first opening portions.

20 Claims, 17 Drawing Sheets

(51) Int. Cl.
*H10K 50/86* (2023.01)
*H10K 59/122* (2023.01)
*H10K 59/35* (2023.01)

(52) U.S. Cl.
CPC ......... *H10K 50/865* (2023.02); *H10K 59/122* (2023.02); *H10K 59/351* (2023.02)

(58) Field of Classification Search
CPC .............. H01L 27/3234; H01L 27/326; H01L 27/3211; H01L 27/322; H01L 27/323; H01L 27/3248; H01L 27/3262; H01L 27/3265; H01L 27/3279; H01L 27/3244; H01L 51/52; G06F 3/0412; G06F 3/041; G06V 40/1318; G06V 10/145; G06V 10/147; G06V 40/1324
USPC .......................................... 345/618, 619, 175
See application file for complete search history.

(56) References Cited

U.S. PATENT DOCUMENTS

| | | |
|---|---|---|
| 2013/0120760 A1 | 5/2013 | Raguin et al. |
| 2017/0351898 A1 | 12/2017 | Zhang |
| 2018/0046837 A1 | 2/2018 | Gozzini et al. |
| 2018/0225498 A1 | 8/2018 | Setlak et al. |
| 2018/0260602 A1 | 9/2018 | He et al. |
| 2019/0006440 A1 | 1/2019 | Sun et al. |
| 2019/0065816 A1 | 2/2019 | Reinhold et al. |
| 2019/0207167 A1* | 7/2019 | Lee ..................... H01L 27/3276 |
| 2019/0266376 A1* | 8/2019 | He ....................... G06V 10/147 |
| 2019/0272407 A1* | 9/2019 | Park ...................... H10K 59/65 |
| 2019/0354740 A1 | 11/2019 | Li et al. |
| 2019/0362120 A1 | 11/2019 | Yeke Yazdandoost et al. |
| 2020/0042762 A1 | 2/2020 | Fu et al. |
| 2020/0232637 A1 | 7/2020 | Kim et al. |
| 2020/0279090 A1 | 9/2020 | He et al. |
| 2020/0286961 A1* | 9/2020 | Jeong ................... H01L 27/323 |
| 2020/0349332 A1 | 11/2020 | Lillie et al. |
| 2021/0042495 A1 | 2/2021 | Song et al. |
| 2021/0083026 A1 | 3/2021 | Oh et al. |
| 2021/0089156 A1* | 3/2021 | Nakanishi ............. G06F 3/0445 |
| 2021/0089742 A1* | 3/2021 | Kim ....................... H10K 59/00 |
| 2021/0342567 A1* | 11/2021 | Park ................... G06V 40/1318 |
| 2021/0359022 A1 | 11/2021 | Tanaka |
| 2021/0359023 A1* | 11/2021 | Ye ......................... H10K 59/121 |
| 2021/0373372 A1* | 12/2021 | Kimura ............... G02F 1/13338 |

\* cited by examiner

FINGERPRINT SENSOR AND DISPLAY DEVICE INCLUDING THE SAME

CROSS-REFERENCE TO RELATED APPLICATIONS

This application is a continuation of U.S. patent application Ser. No. 16/875,185, filed May 15, 2020, which claims priority to and the benefit of Korean Patent Application No. 10-2019-0062644, filed May 28, 2019, the entire content of both of which is incorporated herein by reference.

BACKGROUND

1. Field

Aspects of some example embodiments of the present disclosure relate to a fingerprint sensor and a display device including the fingerprint sensor.

2. Description of the Related Art

In recent years, as display devices such as smartphones or a tablet PCs have been widely used, biometric information authentication methods using a fingerprint of users may be used. In order to provide a fingerprint sensing function, a fingerprint sensor may be provided in a form embedded or attached to a display device.

For example, the fingerprint sensor may be configured of a sensor of a light sense method. The fingerprint sensor of the light sense method may include a light source, a lens, and a light sensor array. When such a fingerprint sensor is attached to a display panel, a thickness of the display device may increase and a manufacturing cost may increase.

The above information disclosed in this Background section is only for enhancement of understanding of the background and therefore the information discussed in this Background section does not necessarily constitute prior art.

SUMMARY

Aspects of some example embodiments of the present disclosure may include a fingerprint sensor of a light sense method capable of reducing a manufacturing cost of a display device, and a display device including the fingerprint sensor.

In addition, some example embodiments may include a fingerprint sensor including a including a light transmission area capable of selectively receiving reflection light from a user's finger without including a separate light shielding layer, and a display device including the fingerprint sensor.

In addition, some example embodiments may include a fingerprint sensor capable of selectively receiving reflection light by forming an opening portion in a pixel definition layer having a high reflectance, and a display device including the fingerprint sensor.

In addition, some example embodiments may include a fingerprint sensor that arranges a light transmission area so that an effective image area extracted from reflection light may be maximized, and a display device including the fingerprint sensor.

According to some example embodiments of the disclosure, a fingerprint sensor includes a substrate, a circuit element layer on a first surface of the substrate and including a plurality of conductive layers, a light emitting element layer on the circuit element layer and including light emitting elements and a light shielding layer, and a light sensor layer on a second surface of the substrate and including light sensors. The light shielding layer may include contact holes exposing first electrodes of the light emitting elements, and first opening portions exposing a portion of the circuit element layer, and the circuit element layer may include second opening portions formed in the plurality of conductive layers and includes a light transmission hole of which at least a portion overlaps the first opening portions.

According to some example embodiments, the light emitting element layer may include the first electrodes on the circuit element layer and exposed by the contact holes to form light emitting areas, light emitting layers on the exposed first electrodes, and second electrodes on the light shielding layer to cover the light emitting layers. Each of the first opening portions may be formed adjacent to at least a portion of the light emitting areas.

According to some example embodiments, the first opening portions may be arranged along a diagonal direction with respect to a first direction along which the light emitting areas are arranged or with respect to a second direction perpendicular to the first direction.

According to some example embodiments, distances between adjacent two first opening portions are substantially equal to each other.

According to some example embodiments, the light emitting areas may include a first light emitting area emitting a first color, a second light emitting area emitting a second color, and a third light emitting area emitting a third color.

According to some example embodiments, the first color may be red, the second color may be green, and the third color may be blue. The first opening portions may be arranged adjacent to at least one of the first light emitting area or the third light emitting area.

According to some example embodiments, the light emitting areas may configure unit pixels including the first light emitting area, the second light emitting area, and the third light emitting area, and the first opening portions may be arranged adjacent to at least a part of the unit pixels.

According to some example embodiments, the first opening portions may be at intervals of eight unit pixels in the first direction and at intervals of seven unit pixels in the second direction.

According to some example embodiments, the unit pixels may include the first light emitting area, the second light emitting area, and the third light emitting area which are sequentially arranged, and the first opening portions may be arranged adjacent to the first light emitting area of at least a part of the unit pixels.

According to some example embodiments, the unit pixels may include first unit pixels in which the first light emitting area and the second light emitting area are sequentially arranged, and second unit pixels in which the third light emitting area and the second light emitting area are sequentially arranged. The first unit pixels and the second unit pixels may be alternately arranged.

According to some example embodiments, the first opening portions may be arranged adjacent to the first light emitting area of at least a part of the first unit pixels and the third light emitting area of at least a part of the second unit pixels.

According to some example embodiments, one of two first opening portions adjacent in the diagonal direction may be arranged adjacent to one of the first unit pixels and the other may be arranged adjacent to one of the second unit pixels.

According to some example embodiments, the circuit element layer may include a semiconductor layer on the substrate and including at least one active pattern, a first conductive layer on at least one active pattern and including at least one gate electrode, a second conductive layer on the first conductive layer and including at least one capacitor electrode, and a third conductive layer on the second conductive layer and including at least one wire, and at least one insulating layer may be interposed between the first conductive layer, at least one insulating layer may be interposed between the second conductive layer, and at least one insulating layer may be interposed between the third conductive layer.

According to some example embodiments, the light transmission hole may include the second opening portions formed to overlap each other in at least two of the semiconductor layer, the first conductive layer, the second conductive layer, and the third conductive layer.

According to some example embodiments, the first opening portions and the light transmission hole may guide light incident from an outside to the light sensors.

According to some example embodiments, a display device according to some example embodiments of the disclosure may include a display panel including a substrate, a circuit element layer on a first surface of the substrate and including a plurality of conductive layers, and a light emitting element layer on the circuit element layer and including light emitting elements and a light shielding layer, and a light sensor layer on a second surface of the display panel and including light sensors. The light shielding layer may include contact holes exposing first electrodes of the light emitting elements, and first opening portions exposing a portion of the circuit element layer. The circuit element layer may include second opening portions formed in the plurality of conductive layers and includes a light transmission hole of which at least a portion overlaps the first opening portions.

According to some example embodiments, the light emitting element layer may include the first electrodes on the circuit element layer and exposed by the contact holes to form light emitting areas, light emitting layers on the exposed first electrodes, and second electrodes on the light shielding layer to cover the light emitting layers. Each of the first opening portions may be formed adjacent to at least a portion of the light emitting areas.

According to some example embodiments, the first opening portions may be arranged along a diagonal direction with respect to a first direction along which the light emitting areas are arranged or with respect to a second direction perpendicular to the first direction.

According to some example embodiments, distances between adjacent two first opening portions are substantially equal to each other.

According to some example embodiments, the circuit element layer may include a semiconductor layer on the substrate and including at least one active pattern, a first conductive layer on at least one active pattern and including at least one gate electrode, a second conductive layer on the first conductive layer and including at least one capacitor electrode, and a third conductive layer on the second conductive layer and including at least one wire, at least one insulating layer may be interposed between the first conductive layer, at least one insulating layer may be interposed between the second conductive layer, and at least one insulating layer may be interposed between the third conductive layer, and the light transmission hole may include the second opening portions formed to overlap each other in at least two of the semiconductor layer, the first conductive layer, the second conductive layer, and the third conductive layer.

According to some example embodiments, the fingerprint sensor and the display device including the fingerprint sensor may reduce a module thickness of the display device by integrally forming the light transmission area with the circuit element layer and the light emitting layer in the fingerprint sensor of a light sense type.

According to some example embodiments, the fingerprint sensor and the display device including the fingerprint sensor according to the disclosure may improve efficiency and reliability of fingerprint sensing by maximizing an effective image area.

BRIEF DESCRIPTION OF THE DRAWINGS

The above and other features of the invention will become more apparent by describing in further detail aspects of some example embodiments thereof with reference to the accompanying drawings, in which.

DETAILED DESCRIPTION

Figure 1:
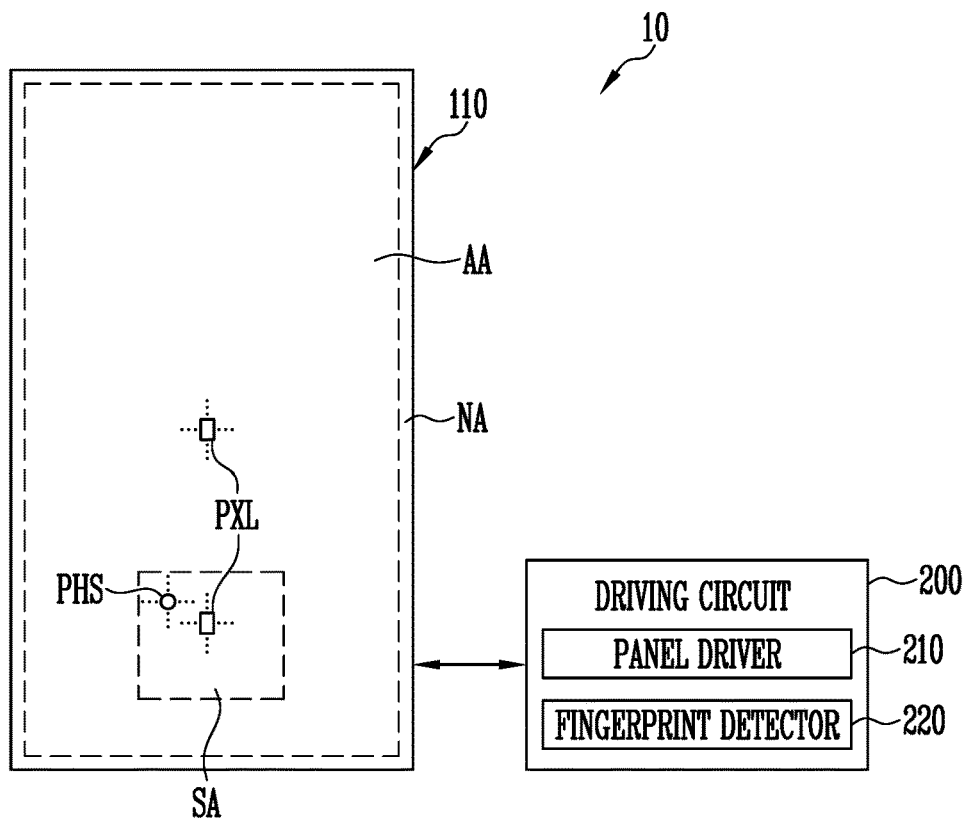
FIGS. 1 and 2 are diagrams schematically illustrating a display device according to some example embodiments of the disclosure.

Hereinafter, aspects of some example embodiments of the disclosure will be described in more detail with reference to the accompanying drawings. The same or similar reference numerals are used for the same components in the drawings.

Figure 2:
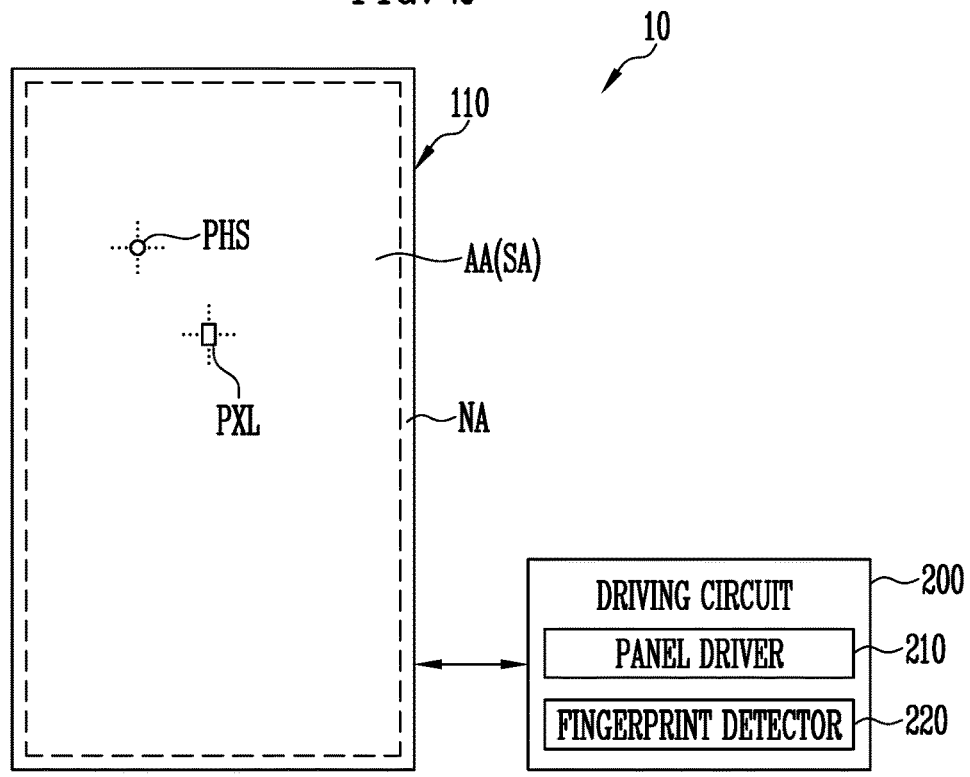

FIGS. 1 and 2 are diagrams schematically illustrating a display device according to some example embodiments of the disclosure. More specifically, FIGS. 1 and 2 are diagrams schematically illustrating a display panel included in a display device according to some example embodiments of the disclosure and a driving circuit for driving the display panel. For convenience, in FIGS. 1 and 2, the display panel and the driving circuit are separate from each other, but the disclosure is not limited thereto. For example, all or a part of the driving circuit may be integrally implemented on the display panel.

Referring to FIGS. 1 and 2, a display device 10 includes a display panel 110 and a driving circuit 200 for driving the display panel 110.

The display panel 110 includes a display area AA and a non-display area NA. The display area AA is an area where a plurality of pixels PXL (which may be referred to as sub pixels) are provided, and may be referred to as an active area. In various embodiments, each of the pixels PXL may include at least one light emitting element. The display device 10 displays an image on the display area AA by driving the pixels PXL corresponding to externally input image data.

According to some example embodiments of the disclosure, the display area AA may include a sensing area SA. The sensing area SA may include at least some of the pixels PXL of the pixels PXL provided in the display area AA.

According to some example embodiments, at least a portion of the display area AA may be set as the sensing area SA, as shown in FIG. 1. According to some example embodiments, the entire display area AA may be set as the sensing area SA as shown in FIG. 2.

Meanwhile, although FIG. 1 shows an example in which only one sensing area SA is formed on the display area AA, the technical spirit of the disclosure is not limited thereto. That is, according to some example embodiments, a plurality of regularly or irregularly arranged sensing areas SA may be formed on the display area AA. According to some example embodiments, the plurality of sensing areas SA may have the same or different areas and shapes.

In addition, although FIG. 1 shows an example in which the sensing area SA is formed in at least a portion of the display area AA, but the technical spirit of the disclosure is not limited thereto. That is, according to some example embodiments, the display area AA and the sensing area SA may be provided so as to overlap only at least portions of the display area AA and the sensing area SA.

The non-display area NA is an area arranged around the display area AA and may be referred to as a non-active area. According to some example embodiments, the non-display area NA may comprehensively mean an area other than the display area AA on the display panel 110. According to some example embodiments, the non-display area NA may include a wire area, a pad area, various dummy areas, and the like.

According to some example embodiments according to the disclosure, the display device 10 may further include a plurality of light sensors PHS provided in the sensing area SA. According to some example embodiments, the light sensors PHSs may sense that light emitted from a light source is reflected by a user's finger and analyze the reflection light to sense the user's fingerprint. Hereinafter, the disclosure will be described by using an example in which the light sensors PHS are used for a fingerprint sense purpose, but in various embodiments, the light sensors PHS may be used for the purpose of performing various functions such as a touch sensor or a scanner.

According to some example embodiments of the disclosure, the light sensors PHS may be located on the sensing area SA. At this time, the light sensors PHS may overlap at least a part or all of the pixels PXL provided on the sensing area SA, or may be arranged around the pixels PXL. For example, at least some or all of the light sensors PHS may be provided between the pixels PXL. Various embodiments of a structural relationship between the light sensor PHS and the pixel PXL will be described in more detail with reference to FIGS. 3A to 3E.

According to some example embodiments in which the light sensors PHS are provided adjacent to the pixels PXL, the light sensors PHS may use the light emitting element provided in at least one pixel PXL located at or around the sensing area SA as the light source. In such embodiments, the light sensors PHS may configure a fingerprint sensor of a light sense method together with the pixels PXL of the sensing area SA, particularly the light emitting elements provided in the pixels PXL. As described above, when the fingerprint sensor built-in type display device is configured by using the pixels PXL as the light source without a separate external light source, a module thickness of the fingerprint sensor of the light sense method and the display device including the fingerprint sensor may be reduced, and a manufacturing cost may be reduced.

According to some example embodiments, the light sensors PHS may be located on a rear surface (for example, a back surface) of two surfaces of the display panel 110, which is opposite to a surface (for example, a front surface) where the image is displayed. However, the disclosure is not limited thereto.

The driving circuit 200 may drive the display panel 110. For example, the driving circuit 200 may output a data signal corresponding to the image data to the display panel 110, or may output a driving signal for the light sensors PHS and receive a sensing signal received from the light sensors PHS. The driving circuit 200 receiving the sensing signal may detect a fingerprint form of the user using the sensing signal.

According to some example embodiments of the disclosure, the driving circuit 200 may include a panel driver 210 and a fingerprint detector 220. For convenience, in FIGS. 1 and 2, the panel driver 210 and the fingerprint detector 220 are separate from each other, but the technical spirit of the disclosure is not limited thereto. For example, at least a part of the fingerprint detector 220 may be integrated with the panel driver 210 or may operate in conjunction with the panel driver 210.

The panel driver 210 may sequentially supply the data signals corresponding to the image data to the pixels PXL while sequentially scanning the pixels PXL of the display area AA. Then, the display panel 110 may display an image corresponding to the image data.

According to some example embodiments, the panel driver 210 may supply a driving signal for fingerprint sensing to the pixels PXL. The driving signal may be provided so that the pixels PXL emit light and operate as the light source for the light sensor PHS. In such embodiments, the driving signal for the fingerprint sensing may be provided to the pixels PXL provided in a specific area within the display panel 110, for example, the pixels PXL provided in the sensing area SA. According to some example embodiments, the driving signal for the fingerprint sensing may be provided by the fingerprint detector 220.

The fingerprint detector 220 may transfer the driving signal for driving the light sensors PHS to the light sensors PHS and may detect the user fingerprint based on the sensing signal received from the light sensors PHS.

FIGS. 3A to 3E are plan views illustrating various embodiments of a structural arrangement of the pixels and the light sensors. FIGS. 3A to 3E show different embodiments related to a relative size, a resolution, and a relative structural arrangement relationship between at least one pixel PXL and light sensors PHS provided in the sensing area SA.

Figure 3A:
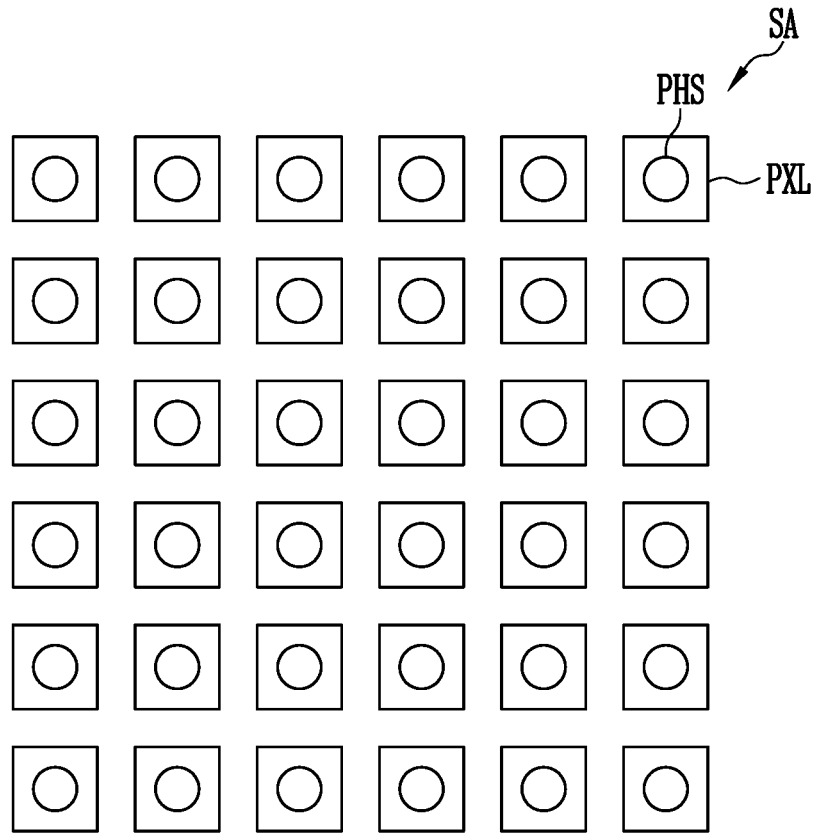
FIGS. 3A to 3E are plan views illustrating a structural relationship of pixels and light sensors according to some example embodiments of the disclosure.

Referring to FIG. 3A, in the sensing area SA, the light sensors PHS may be arranged with the same resolution (density) as the pixels PXL. In other words, the same number of light sensors PHS as the pixels PXL may be located in the sensing area SA. In such embodiments, the pixels PXL and the light sensors PHS may be arranged to form a 1:1 pair. In embodiments according to FIG. 3A, the pixels PXL and the light sensors PHS may be arranged to overlap with each other, but in other embodiments, the pixels PXL and the light sensors PHS may be arranged so as not to overlap with each other or only portions of the pixels PXL and the light sensors PHS overlap with each other.

Meanwhile, in embodiments according to FIG. 3A, the light sensors PHS may have a size smaller than that of the pixels PXL, but the technical spirit of the disclosure is not limited thereto. That is, in other embodiments, the light sensors PHS may have the same size as the pixels PXL or may have a size larger than that of the pixels PXL. Such an embodiment is shown in FIG. 3E.

Referring to FIGS. 3B to 3E, the light sensors PHS may be arranged with a resolution lower than that of the pixels PXL in the sensing area SA. In other words, the light sensors PHS of the number smaller than that of the pixels PXL may be located in the sensing area SA. In FIGS. 3B to 3E, an example in which one light sensor PHS is arranged per four pixels PXL is shown, but the disclosure is not limited thereto.

Figure 3B:
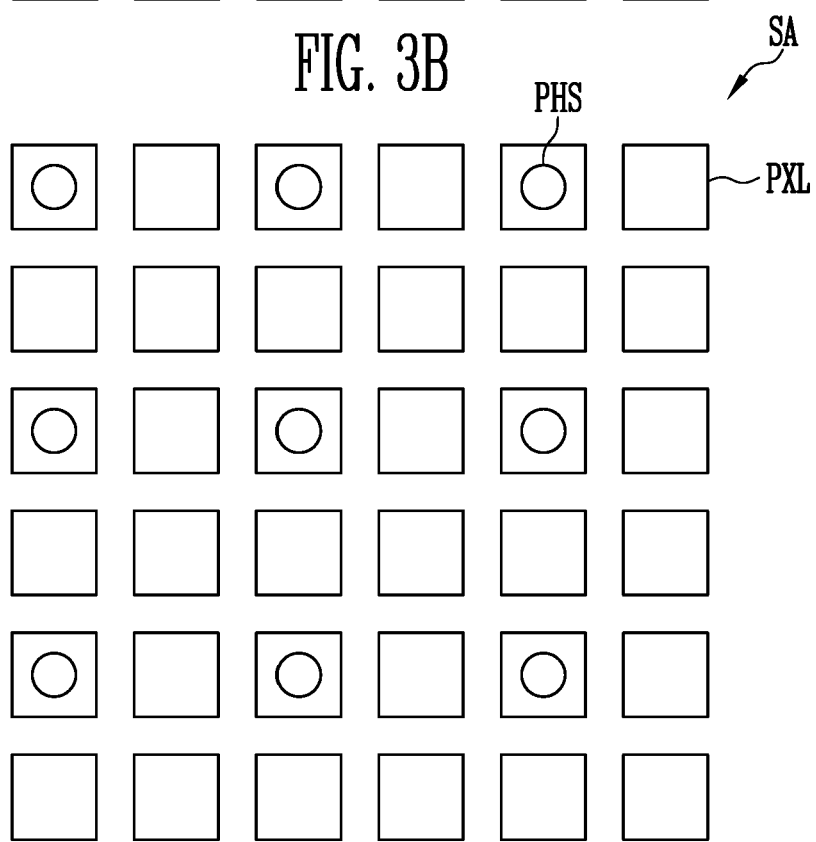
Figure 3C:
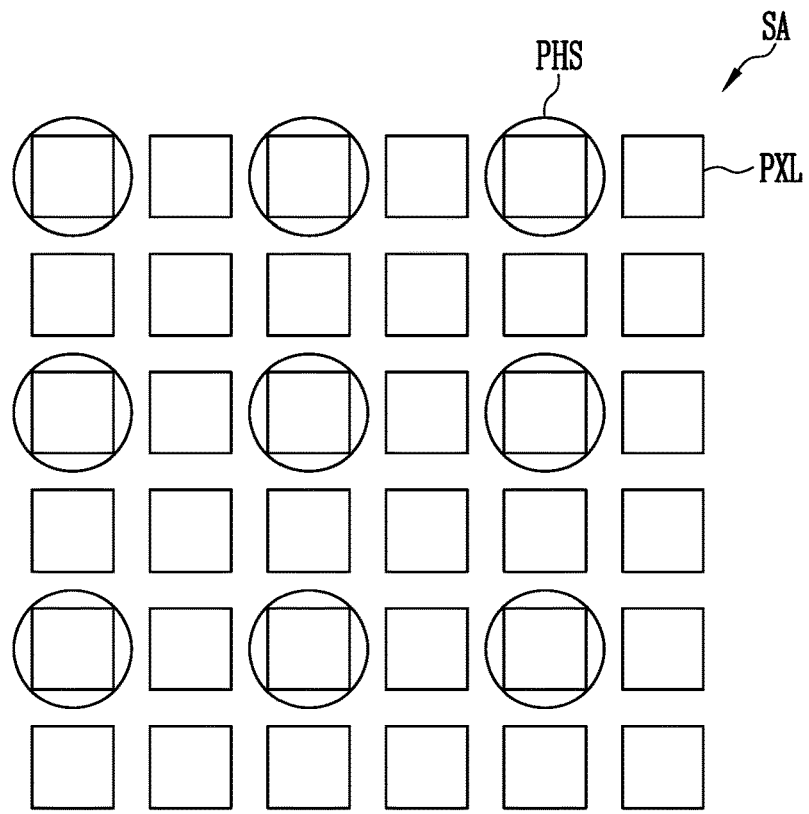
Figure 3D:
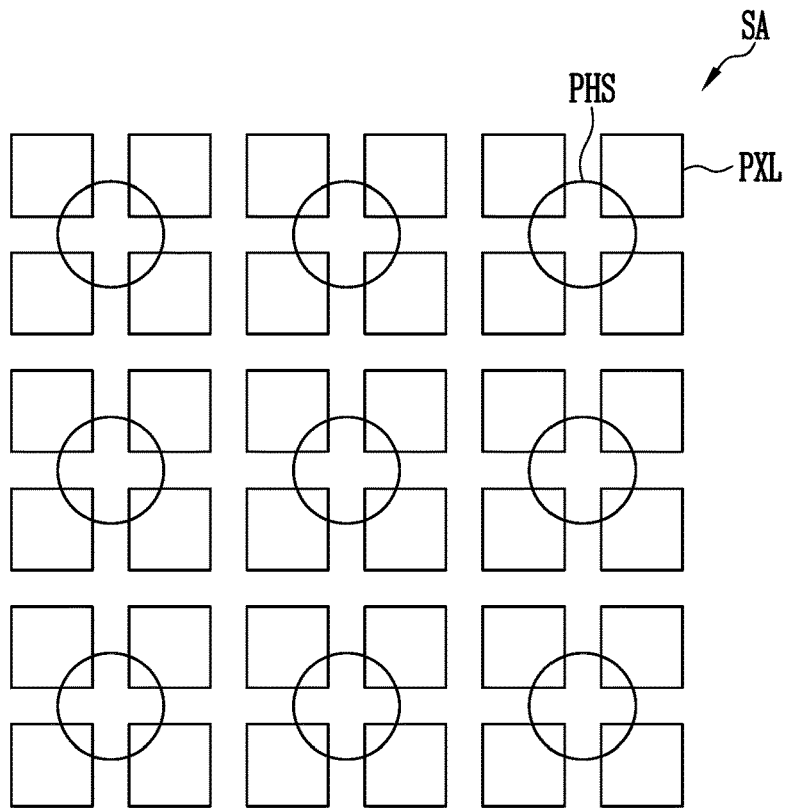
Figure 3E:
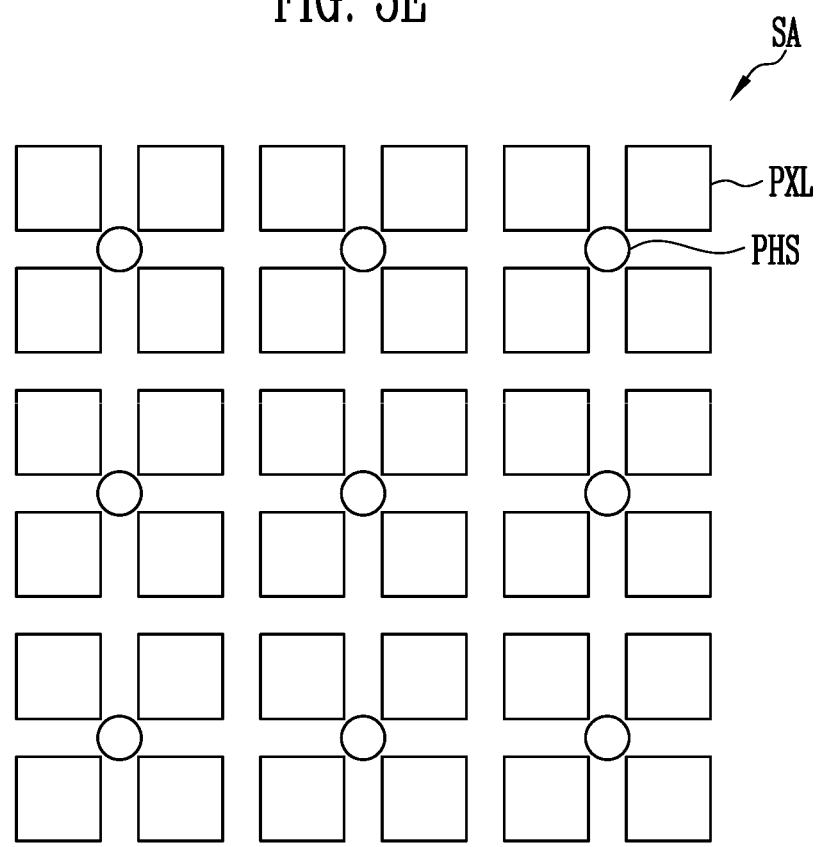

In such embodiments, the light sensors PHS may have a size smaller than that of the pixels PXL as shown in FIGS. 3B and 3E, or may have a size larger than that of the pixels PXL as shown in FIGS. 3C and 3D.

When the light sensors PHS are arranged with the resolution lower than that of the pixels PXL, a part or all of the light sensors PHS may be arranged to overlap the pixels PXL. That is, the light sensors PHS may partially overlap with a part of the pixels PXL as shown in FIGS. 3B and 3C.

Alternatively, the light sensors PHS may be positioned between the pixels PXL and partially overlap the pixels PXL as shown in FIG. 3D. In such embodiments, the light sensors PHS may have the size larger than that of the pixels PXL as shown in FIG. 3D. For example, the light sensors PHS may have a size to cover at least one pixel PXL.

Alternatively, the light sensors PHS may not overlap the pixels PXL as shown in FIG. 3E.

According to some example embodiments of the disclosure, the relative structural arrangement between the pixels PXL and the light sensors PHS is not limited to the relative structural arrangement described above. That is, a shape, an arrangement, a relative size, the number, a resolution, and the like of the pixels PXL and the light sensors PHS in the sensing area SA may be variously modified within the scope of the technical spirit of the disclosure. In addition, in various embodiments, the pixels PXL and the light sensors PHS may be arranged in a form or structure in which one or more of the embodiments of FIGS. 3A to 3E are combined.

In addition, FIGS. 3A to 3E illustrate an example in which the light sensors PHS are regularly arranged in the sensing area SA, but the technical spirit of the disclosure is not limited thereto, and in other embodiments, the light sensors PHS may be irregularly arranged in the sensing area SA.

Figure 4:
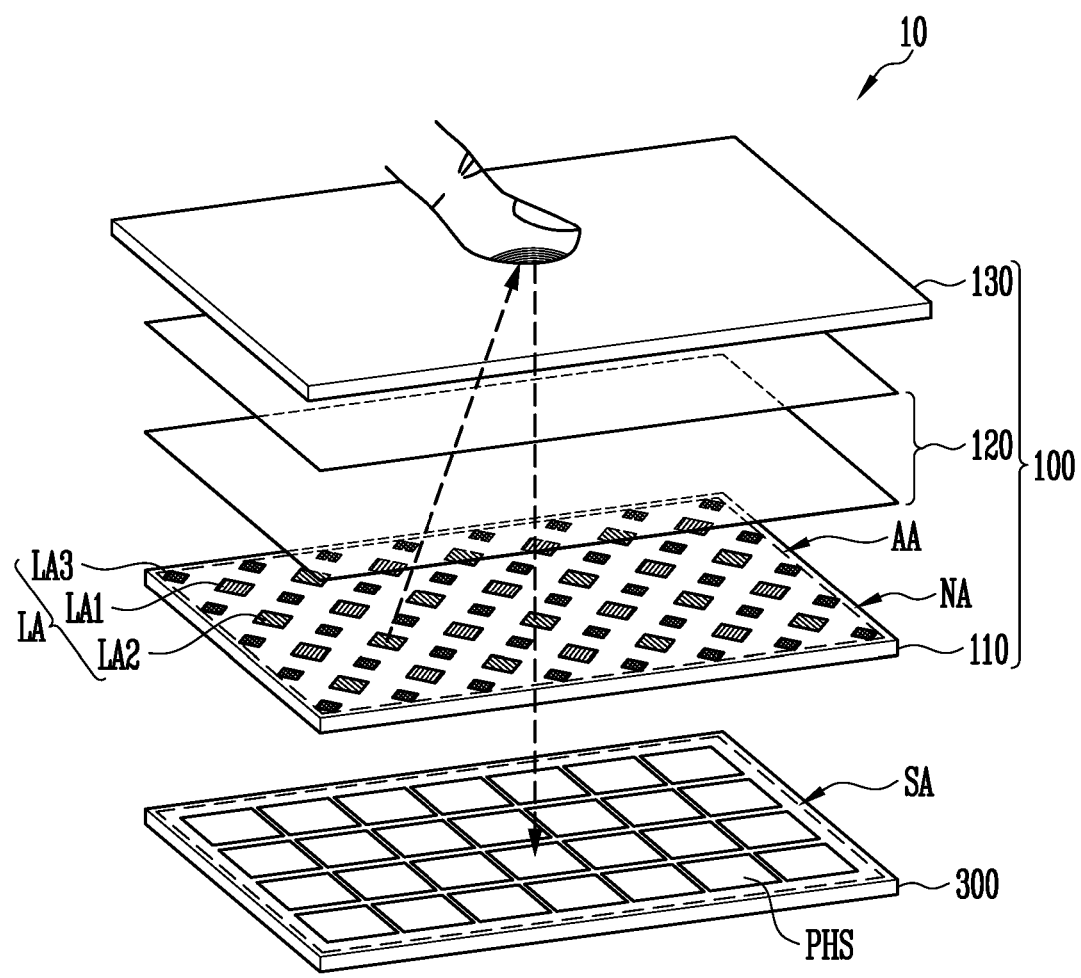
FIG. 4 is an exploded perspective view of a display device according to some example embodiments of the disclosure.
Figure 5:
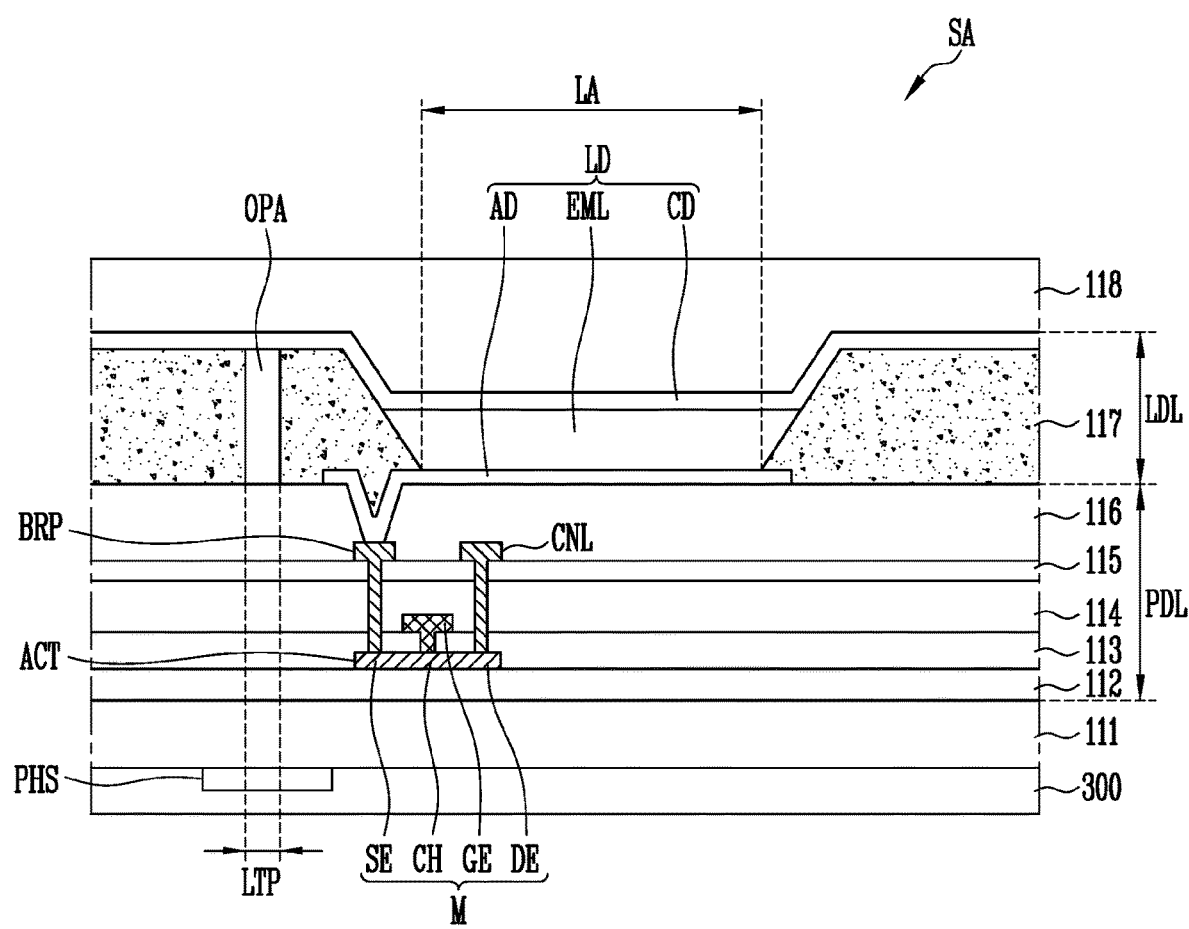
FIG. 5 is a cross-sectional view of a display device according to some example embodiments of the disclosure.

FIG. 4 is an exploded perspective view of a display device according to some example embodiments of the disclosure. FIG. 5 is a cross-sectional view of a display device according to some example embodiments of the disclosure. FIGS. 4 and 5 particularly show a cross-sectional view in the sensing area SA shown in FIGS. 1 and 2.

Referring to FIGS. 4 and 5, a display device 10 according to some example embodiments of the disclosure may include a display module 100 including a display panel 110, and a light sensor layer 300 located on one surface of the display panel 110.

The display module 100 may include the display panel 110, one or more functional layers 120 located at an image display surface (for example, the front surface) of the display panel 110, and a window 130. However, at least one of the functional layer 120 or the window 130 may be omitted or may be incorporated with the display panel 110.

The display panel 110 includes a plurality of light emitting areas LA located in the display area AA. Each of the light emitting areas LA may configure each of the pixels PXL.

The light emitting areas LA include first light emitting areas LA1 that emit light of a first color (for example, red), second light emitting areas LA2 that emit light of a second color (for example, blue), and third light emitting areas LA3 that emit light of a third color (for example, green). However, the technical spirit of the disclosure is not limited thereto, and in other embodiments, the light emitting areas LA may emit one color of cyan, magenta, yellow, and white.

The light emitting areas LA may be dispersed in the display area AA according to a rule (e.g., a predetermined rule). For example, the light emitting areas LA are dispersed in the display area AA in a pentile form, but the light emitting areas LA may be dispersed in the display area AA in a stripe form. In addition, the light emitting areas LA are shown in a diamond shape, but the light emitting areas LA may have various shapes such as a circle, an ellipse, a square, and a rectangle.

The display panel 110 may include a substrate 111. The substrate 111 may include a transparent insulating material to transmit light. In addition, the substrate 111 may be a rigid substrate or a flexible substrate.

The rigid substrate may include a glass substrate, a quartz substrate, a glass ceramic substrate, and a crystalline glass substrate. The flexible substrate may include a film substrate including a polymeric organic material and a plastic substrate. For example, the flexible substrate SUB may include at least one of polyethersulfone ("PES"), polyacrylate, polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), triacetate cellulose ("TAC"), or cellulose acetate propionate ("CAP"). In addition, the flexible substrate may include fiberglass reinforced plastic ("FRP").

The material to be applied to the substrate 111 may preferable have resistance (or heat resistance) to a high process temperature in a manufacturing process of the display device 10. According to some example embodiments of the disclosure, the entire the substrate 111 or at least some of the substrate 111 may have flexibility.

A light emitting element LD and at least one transistor M connected to the light emitting element LD configuring the plurality of pixels PXL are located on the substrate 111. The at least one transistor M may be located on a circuit element layer PDL on the substrate 111.

The circuit element layer PDL may include at least one conductive layer. For example, the circuit element layer PDL may include a plurality of circuit elements configuring a pixel circuit of each pixel PXL by including the transistor M, and wires to which power and a signal for driving the pixels are applied.

For example, a buffer layer 112 may be formed on the substrate 111. The buffer layer 112 may prevent or reduce instances of impurities being diffused to upper components which will be described later. The buffer layer 112 may be provided as a single layer or as multiple layers. When the buffer layer 112 is provided as the multiple layers, each layer may be formed of the same or different materials. The buffer layer 112 may be omitted according to the material and a process condition of the substrate 111.

An active pattern ACT configuring the transistor M may be formed on the buffer layer 112. A channel CH, a source electrode SE (or a source area), and a drain electrode DE (or a drain area) may be formed in the active pattern ACT.

A gate electrode GE may be arranged so as to overlap the channel CH of the active pattern ACT. At this time, a gate insulating layer 113 may be interposed between the active pattern ACT and the gate electrode GE.

The gate insulating layer 113 may be an inorganic insulating film including an inorganic material. For example, the gate insulating layer 113 may include at least one of silicon nitride, silicon oxide, or silicon oxynitride.

The gate electrode GE may be covered with a first insulating interlayer 114. The first insulating interlayer 114 may be formed of a single layer as shown in the drawing, or may be formed of multiple layers. When the first insulating interlayer 114 is formed of the multiple layers, the first insulating interlayer 114 may have a structure in which a plurality of inorganic insulating films or a plurality of organic insulating films are alternately stacked. For example, the first insulating interlayer 114 may have a structure in which a first organic insulating layer, an inorganic insulating layer, and a second organic insulating layer are sequentially stacked, but is not limited thereto.

A second insulating interlayer 115 may be provided on the first insulating interlayer 114. The second insulating interlayer 115 may cover conductive patterns provided on the first insulating interlayer 114. The second insulating interlayer 115 may be formed of a single layer or multiple layers similarly to the first insulating interlayer 114. According to some example embodiments, the first insulating interlayer 114 and the second insulating interlayer 115 may be formed of the same or different materials and structures.

A conductive pattern such as a connection wire CNL may be provided on the second insulating interlayer 115. According to some example embodiments, the connection wire CNL may be connected to a component of a lower layer through a contact hole passing through the gate insulating layer 113, the first insulating interlayer 114, and the second insulating interlayer 115. In FIG. 5, an example in which the connection wire CNL is connected to the drain electrode DE is shown.

A bridge pattern BRP may further be provided on the second insulating interlayer 115. The bridge pattern BRP may be connected to a component of a lower layer through a contact hole passing through the gate insulating layer 113, the first insulating interlayer 114, and the second insulating interlayer 115. In FIG. 5, an example in which the bridge pattern BRP is connected to the source electrode SE is shown.

A protective layer 116 may be provided on the second insulating interlayer 115. The light emitting element LD may be located on the protective layer 116. The light emitting element LD may be located on a light emitting element layer LDL on the circuit element layer PDL.

The light emitting element LD may be electrically connected to the transistor M through a contact hole formed through the protective layer 116. For example, the light emitting element LD may be connected to the bridge pattern BRP through the contact hole formed through the protective layer 116, and may be connected to the transistor M through the bridge pattern BRP. However, the technical spirit of the disclosure is not limited thereto.

The light emitting element LD includes a first electrode AD and a second electrode CD overlapping each other in at least one area, and a light emitting layer EML interposed between the first and second electrodes AD and CD. According to some example embodiments, the first electrode AD and the second electrode CD may be an anode electrode and a cathode electrode, respectively. However, the technical spirit of the disclosure is not limited thereto. For example, the first electrode AD electrically connected to the transistor M may be a cathode electrode according to a pixel structure.

The light emitting layer EML may be arranged on an exposed surface of the first electrode AD. The light emitting layer EML may have a multilayer thin film structure including a light generation layer. For example, the light emitting layer EML may include a hole injection layer for injecting holes, a hole transport layer for increasing a hole recombination opportunity by suppressing movement of electrons that are excellent in transportability of holes and are not combined in the light generation layer, the light generation layer for emitting light by recombination of the injected electrons and holes, a hole blocking layer for suppressing the movement of the holes that are not combined in the light generation layer, an electron transport layer for smoothly transporting the electrons to the light generation layer, and an electron injection layer for injecting the electrons.

In various embodiments, an area where the first electrode AD of the light emitting element LD is exposed may form a light emitting area LA. In various embodiments, the light emitting area LA may be referred to as a pixel, a pixel area, a light emitting portion, or the like. The light emitting area LA is shown in a diamond shape, but may have various shapes such as a circle, an ellipse, a square, a rectangle, and the like.

Light emitted from the light emitting area LA may be any one of red, blue, and green. Alternatively, the light emitted from the light emitting area LA may include a white color. Alternatively, light emitted from the light emitting area LA may be any one of cyan, magenta, and yellow.

A pixel definition layer 117 (or pixel definition film) may be formed between the light emitting areas LA. In various embodiments of the disclosure, the pixel definition layer 117 may include an organic insulating material. For example, the pixel definition layer 117 may include at least one of polystyrene, polymethylmethacrylate ("PMMA"), polyacrylonitrile ("PAN"), polyamide ("PA"), polyimide ("PI"), polyarylether ("PAE"), heterocyclic polymer, parylene, epoxy, benzocyclobutene ("BCB"), siloxane based resin, or silane based resin.

In various embodiments of the disclosure, the pixel definition layer 117 may include a material that does not transmit light. For example, the pixel definition layer 117 may be a light shielding material including chromium (Cr) or chromium oxide ($CeO_x$), or a light shielding layer carbon or black pigment.

In such embodiments of the disclosure, an opening portion OPA may be provided in the pixel definition layer 117.

The opening portion OPA may be provided to selectively transmit at least some of light generated in the display panel 110 or incident light incident on the display panel 110. The opening portion OPA may be an "optical opening area" formed by eliminating a portion of the pixel definition layer 117 or formed by a transparent material so that light may be transmitted differently from peripheral areas formed so as not to transmit light.

In various embodiments of the disclosure, the opening portions OPA may be regularly or irregularly arranged on the pixel definition layer 117. For example, the opening portions OPA may be arranged at intervals (e.g., predetermined intervals) between the light emitting areas LA. The opening portion OPA may be formed in a density smaller than that of the light emitting area LA as shown in FIG. 4. However, the technical spirit of the disclosure is not limited thereto.

In various embodiments of the disclosure, the opening portions OPA may have suitable size and intervals to sense a clearer fingerprint pattern while preventing or reducing diffraction of the incident light. For example, in order to prevent or reduce the diffraction of the light, a width of the opening portion OPA may be set to about 10 times or more a wavelength of the incident light. In various embodiments of the disclosure, the size of the opening portions OPA may be smaller than that of the light emitting areas LA. However, the technical spirit of the disclosure is not limited thereto.

According to some example embodiments, the display panel 110 may be configured so that at least a portion thereof is transparent or translucent so as to transmit light. For example, the display panel 110 may include a light transmission area LTP arranged around the light emitting area LA.

The light transmission area LTP may be formed inside the pixels PXL. For example, the light transmission area LTP may be present in a gap where the circuit element (for example, the transistor M) and/or light shielding elements such as wires connected thereto configuring the pixel PXL are not located.

The light transmission area LTP may be formed so that at least a portion of the light transmission area LTP overlaps the opening portion OPA formed in the pixel definition layer 117. That is, the light transmission area LTP may be formed in an area between the light emitting areas LA. Then, reflection light passing through the opening portion OPA may reach a light sensor layer 300 through the light transmission area LTP.

An encapsulation layer 118 may be further formed on the pixel definition layer 117. The encapsulation layer 118 may include a plurality of insulating films covering the light emitting element LD. For example, the encapsulation layer 118 may include a plurality of inorganic films and organic films. For example, the encapsulation layer 118 may have a structure in which an inorganic film and an organic film are alternately stacked. In addition, according to a case, the encapsulation layer 118 may be an encapsulation substrate arranged on the light emitting element LD and adhered to the substrate 111 through a sealant or the like.

A functional layer 120 may include a polarization layer, a touch sensor layer, an adhesive layer, a protective layer, and/or the like, and a configuration of the functional layer 120 is not particularly limited. In addition, the functional layer 120 may be omitted or integrated with the display panel 110. For example, the functional layer 120 may be formed or provided directly on the encapsulation layer 118.

The window 130 may be arranged at the uppermost end of the display module 100. The window 130 may transmits the image from the substrate 111 and alleviate an external impact to prevent or reduce instances of the display device 10 being broken or malfunctioning due to the external impact.

The light sensor layer 300 may be configured in a sensor IC attached to a lower surface of the display panel 110. According to embodiments in which the light sensor layer 300 is provided on the back surface of the display panel 110 as described above, deterioration of image quality of the display device 10 by the light sensor layer 300 may be prevented or reduced.

The light sensor layer 300 may include a light sensor array configured of a plurality of light sensors PHS. The light sensors PHS may be photodiodes, CMOS image sensors, and CCD cameras, but are not limited thereto. The light sensors PHS may have various sizes, numbers, resolutions, and arrangements with respect to the pixels PXL in the display panel 110, as described with reference to FIGS. 3A to 3E.

At least a part of the light sensors PHS may include a light reception portion overlapping the opening portion OPA and the light transmission area LTP between the light emitting areas LA of at least two adjacent pixels PXL. At least a part of the light sensors PHS may output a signal corresponding to light incident on the light reception portion through the opening portion OPA and the light transmission area LTP. The output signal generated by the light sensors PHS may be input to the driving circuit 200 shown in FIGS. 1 and 2 and used to generate fingerprint information of the user. That is, the display device 10 according to some example embodiments of the disclosure may sense the fingerprint pattern of the finger positioned on the display panel 110 using the output signal from the light sensors PHS.

In various embodiments of the disclosure, the display device 10 may be a fingerprint sensor built-in type display device that senses the fingerprint using internal light of the display panel 110. Specifically, during a fingerprint sense period in which the light sensors PHS are activated, the display device 10 may emit at least a part of the pixels PXL of the sensing area SA. The display device 10 may cause all the pixels PXL or some pixels PXL (for example, pixels PXL arranged at specific intervals or pixels PXL emitting light in a specific light) of the sensing area SA to emit light simultaneously or sequentially.

According to some example embodiments, when the user's finger (particularly a fingerprint area) is in contact with the sensing area SA or positioned closely to the sensing area SA, the light emitted from the emitted pixels PXL is reflected at the user's finger and enters the light sensors PHS through the light transmission area LTP. At this time, a light amount and/or a waveform of the reflection light reflected from a ridge and a valley of each fingerprint may be different from each other. As a result, the display device 10 may detect the fingerprint shape (fingerprint pattern) of the user using a characteristic of the reflection light.

In various embodiments, a light filter (for example, an IR filter) for transmitting or shielding light of a specific wavelength may be further located on one surface of the light sensor layer 300, particularly on an upper surface on which the light reception portion of the light sensors PHS is located.

Figure 6:
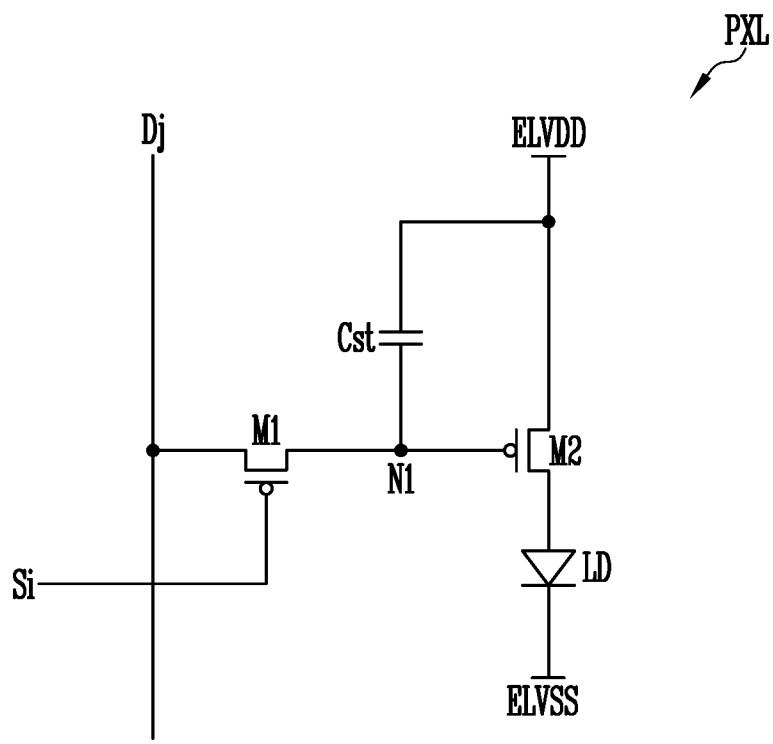
FIG. 6 is a circuit diagram illustrating a pixel according to some example embodiments of the disclosure.

FIG. 6 is a circuit diagram illustrating a pixel according to some example embodiments of the disclosure. In FIG. 6, for convenience of description, an active type pixel connected to an i-th (i is a natural number) scan line Si that is located in an i-th horizontal pixel column and a j-th (j is a natural number) data line Dj that is located in a j-th vertical pixel column and including two transistors is shown. However, a structure of the pixel PXL in the disclosure is not limited to a structure shown in FIG. 6.

Referring to FIG. 6, the pixel PXL according to some example embodiments of the disclosure may include a first transistor M1, a second transistor M2, a storage capacitor Cst, and a light emitting element LD.

The first transistor M1 (driving transistor) is connected between the j-th data line Dj and a first node N1 and a gate electrode of the first transistor M1 is connected to the scan line Si. The first transistor M1 is turned on when a scan signal having a gate-on voltage (for example, a low voltage) is supplied from the scan line Si. When the first transistor M1 is turned on, the j-th data line Dj and the first node N1 may be electrically connected with each other.

The second transistor M2 (switching transistor) is connected between first power ELVDD and the light emitting element LD and a gate electrode of the second transistor M2 is connected to the first node N1. The second transistor M2 controls an amount of a current supplied from the first power ELVDD to second power ELVSS through the light emitting element LD corresponding to a voltage of the first node N1. In various embodiments, the first power ELVDD may be a high potential pixel power and the second power ELVSS may be a low potential pixel power.

The storage capacitor Cst is connected between the first power ELVDD and the first node N1. The storage capacitor Cst may store a voltage corresponding to a data signal supplied to the first node N1.

The light emitting element LD is connected between the second transistor M2 and the second power ELVSS. The light emitting element LD emits light at a luminance corresponding to the current controlled by the second transistor M2. In various embodiments, the light emitting element LD may be an organic light emitting diode ("OLED").

Figure 7:
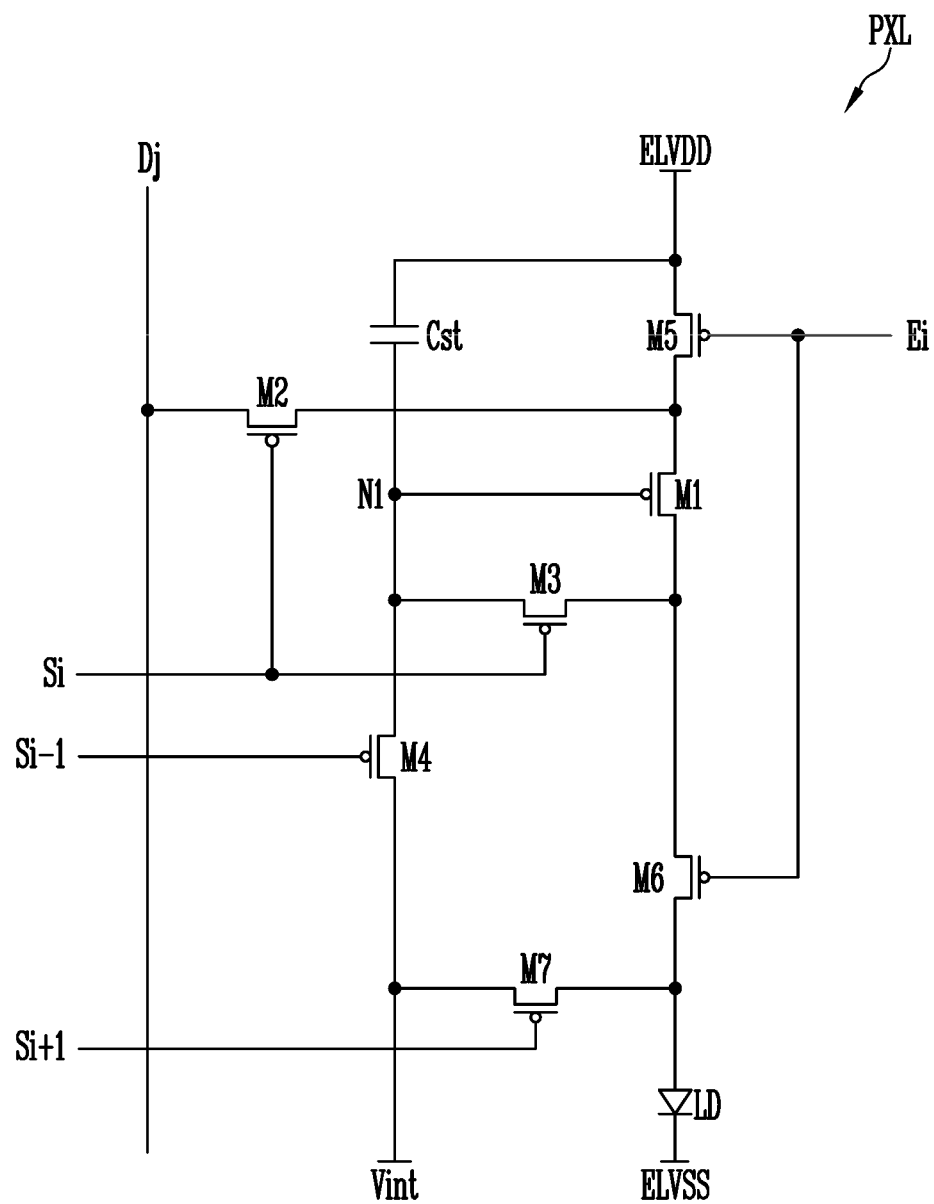
FIG. 7 is a circuit diagram illustrating a pixel according to some example embodiments of the disclosure.

FIG. 7 is a circuit diagram illustrating a pixel according to some example embodiments of the disclosure. In FIG. 7, for convenience of description, an active type pixel connected to an i-th (i is a natural number) scan line Si that is located in an i-th horizontal pixel column and a j-th (j is a natural number) data line Dj that is located in a j-th vertical pixel column and including seven transistors is shown. However, a structure of the pixel PXL in the disclosure is not limited to a structure shown in FIG. 7.

Referring to FIG. 7, a pixel PXL according to some example embodiments of the disclosure may include first to seventh transistors M1 to M7, a storage capacitor Cst, and a light emitting element LD.

A first electrode of the first transistor M1 may be connected to first power ELVDD through the fifth transistor M5 and a second electrode of the first transistor M1 may be connected to an anode electrode the light emitting element LD through the sixth transistor M6. In addition, a gate electrode of the first transistor M1 may be connected to a first node N1. The first transistor M1 may control an amount of a current flowing from the first power ELVDD to second power ELVSS through the light emitting element LD corresponding to a voltage of the first node N1.

The second transistor M2 (switching transistor) may be connected between the j-th data line Dj and the first electrode of the first transistor M1. In addition, a gate electrode of the second transistor M2 may be connected to the i-th scan line Si. The second transistor M2 may be turned on when a scan signal is supplied to the i-th scan line Si to electrically connect the j-th data line Dj and the first electrode of the first transistor M1 with each other.

The third transistor M3 may be connected between the second electrode of the first transistor M1 and the first node N1. In addition, a gate electrode of the third transistor M3 may be connected to the i-th scan line Si. The third transistor M3 may be turned on when a scan signal of a gate-on voltage is supplied to the i-th scan line Si to electrically connect the second electrode of the first transistor M1 and the first node N1 with each other. Therefore, when the third transistor M3 is turned on, the first transistor M1 may be connected in a diode form.

The fourth transistor M4 (initialization transistor) may be connected between the first node N1 and initialization power Vint. In addition, a gate electrode of the fourth transistor M4 may be connected to an (i−1)-th scan line Si−1. The fourth transistor M4 may be turned on when a scan signal is supplied to the (i−1)-th scan line Si−1 to supply a voltage of the initialization power Vint to the first node N1.

FIG. 7 shows an embodiment in which the (i−1)-th scan line Si−1 is used as an initialization control line for initializing a gate node of the first transistor M1, that is, the first node N1. However, the technical spirit of the disclosure is not limited thereto. For example, according to some example embodiments of the disclosure, another control line such as an (i−2)-th scan line Si−2 may be used as the initialization control line for initializing the gate node of the first transistor M1.

The fifth transistor M5 may be connected between the first power ELVDD and the first transistor M1. In addition, a gate electrode of the fifth transistor M5 may be connected to an i-th light emitting control line Ei. The fifth transistor M5 may be turned off when a light emitting control signal of a gate-off voltage is supplied to the i-th light emitting control line Ei, and may be turned on in other cases.

The sixth transistor M6 may be connected between the first transistor M1 and the light emitting element LD. In addition, a gate electrode of the sixth transistor M6 may be connected to the i-th light emitting control line Ei. The sixth transistor M6 may be turned off the light emitting control signal of the gate-off voltage is supplied to the i-th light emitting control line Ei, and may be turned on in other cases.

The seventh transistor M7 may be connected between the initialization power Vint and a first electrode of the light emitting element LD, for example, an anode electrode. In addition, a gate electrode of the seventh transistor M7 may be connected to an (i+1)-th scan line Si+1. The seventh transistor may be turned on when a scan signal of a gate-on voltage (for example, a low level voltage) is supplied to the (i+1)-th scan line Si+1 to supply the voltage of the initialization power Vint to the anode electrode of the light emitting element LD. Here, the voltage of the initialization power Vint may be set to a voltage lower than the data signal. That is, the voltage of the initialization power Vint may be set to be equal to or less than a lowest voltage of the data signal.

FIG. 7 shows a case in which an anode initialization control line to which the gate electrode of the seventh transistor M7 is connected is the (i+1)-th scan line Si+1. However, the technical spirit of the disclosure is not limited thereto. For example, according to some example embodiments of the disclosure, the gate electrode of the seventh transistor M7 may be connected to the i-th scan line Si. In this case, the voltage of the initialization power Vint may be supplied to the anode electrode of the light emitting element LD through the seventh transistor M7 when the scan signal of the gate-on voltage is supplied to the i-th scan line Si.

The storage capacitor Cst may be connected between the first power ELVDD and the first node N1. The storage capacitor Cst may store a voltage corresponding to the data signal and a threshold voltage of the first transistor M1.

The anode electrode of the light emitting element LD may be connected to the first transistor M1 through the sixth transistor M6 and a cathode electrode may be connected to the second power ELVSS. The light emitting element LD generates light of a luminance (e.g., a predetermined luminance) corresponding to the amount of the current supplied from the first transistor M1. A voltage value of the first power ELVDD may be set to be higher than a voltage value of the second power ELVSS so that the current may flow to the light emitting element LD.

On the other hand, the structure of the pixel PXL is not limited to the embodiment shown in FIG. 7. For example, the currently known pixel circuits of various structures may be applied to the pixel PXL.

Figure 8:
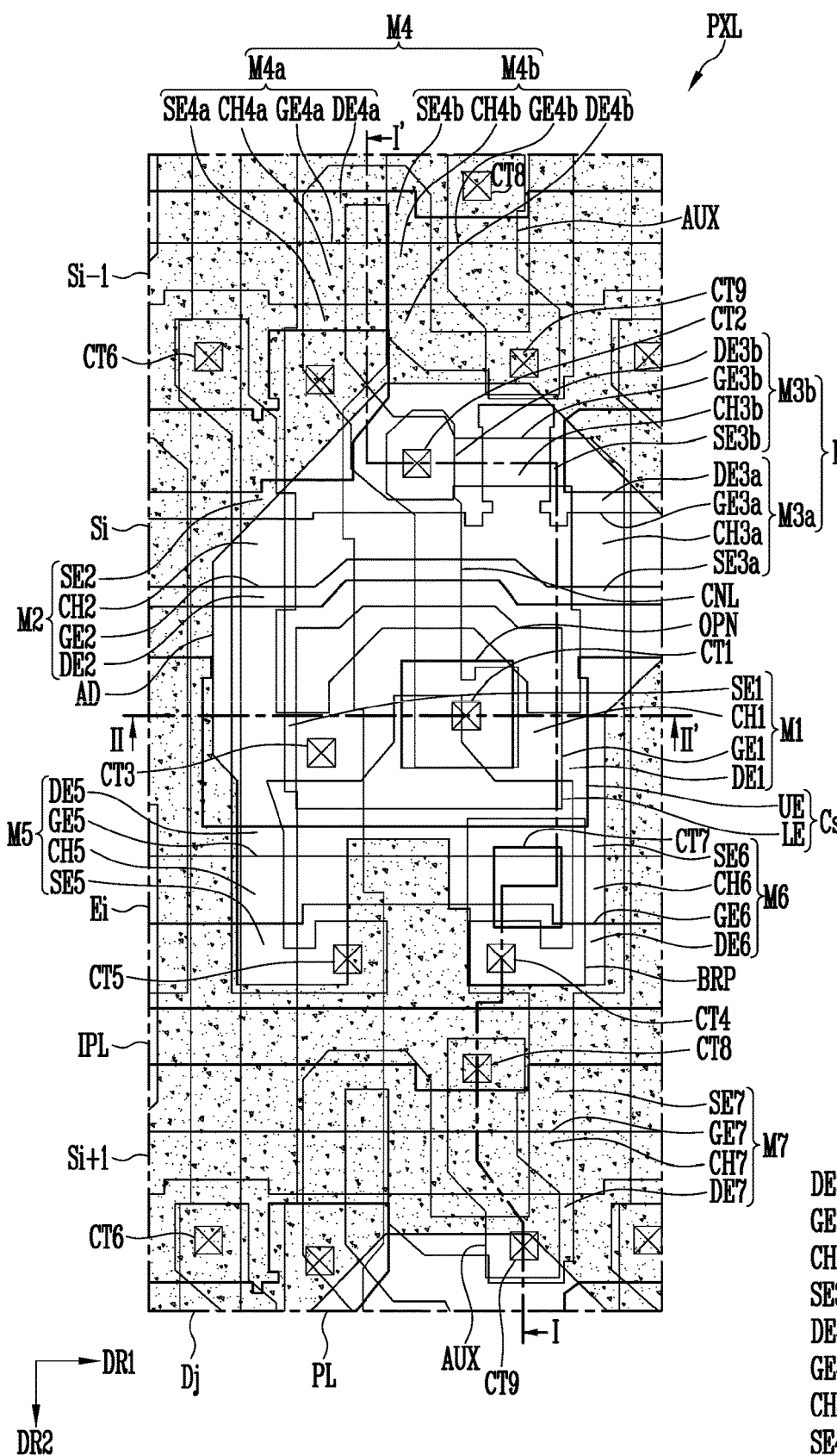
FIG. 8 is a plan view illustrating a layout of the pixel shown in FIG. 7 according to some example embodiments of the disclosure.
Figure 9:
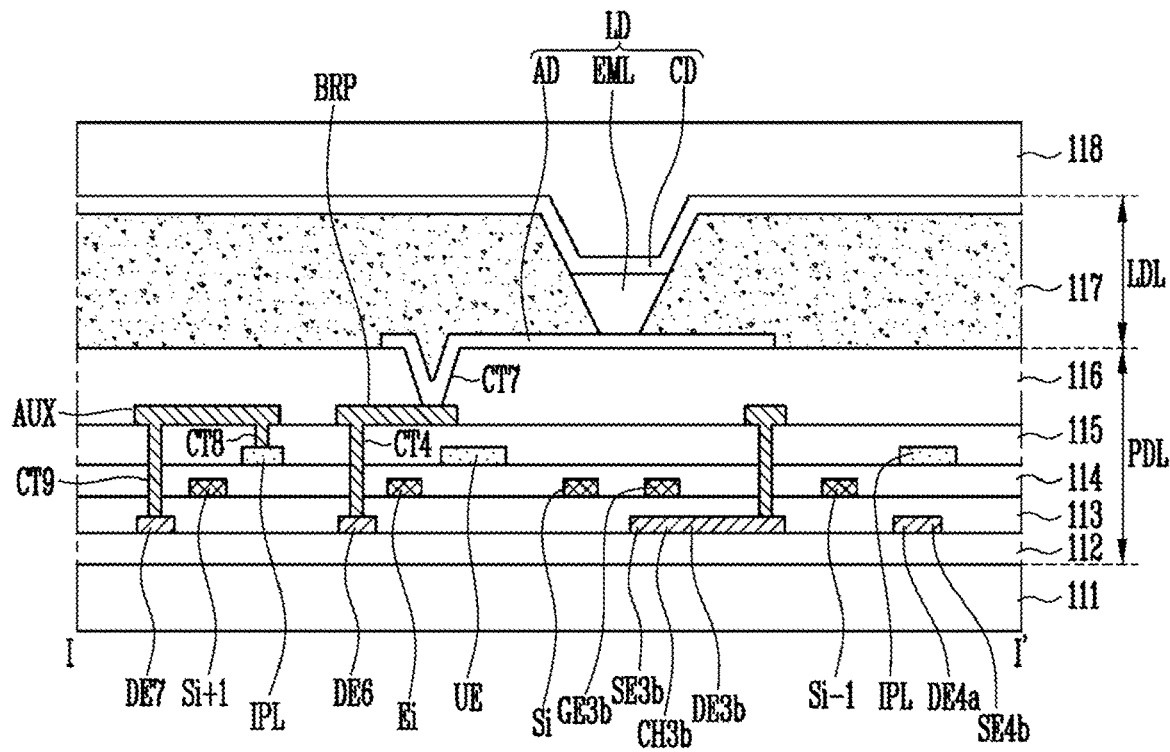
FIG. 9 is a cross-sectional view taken along a line I-I' of FIG. 8.
Figure 10:
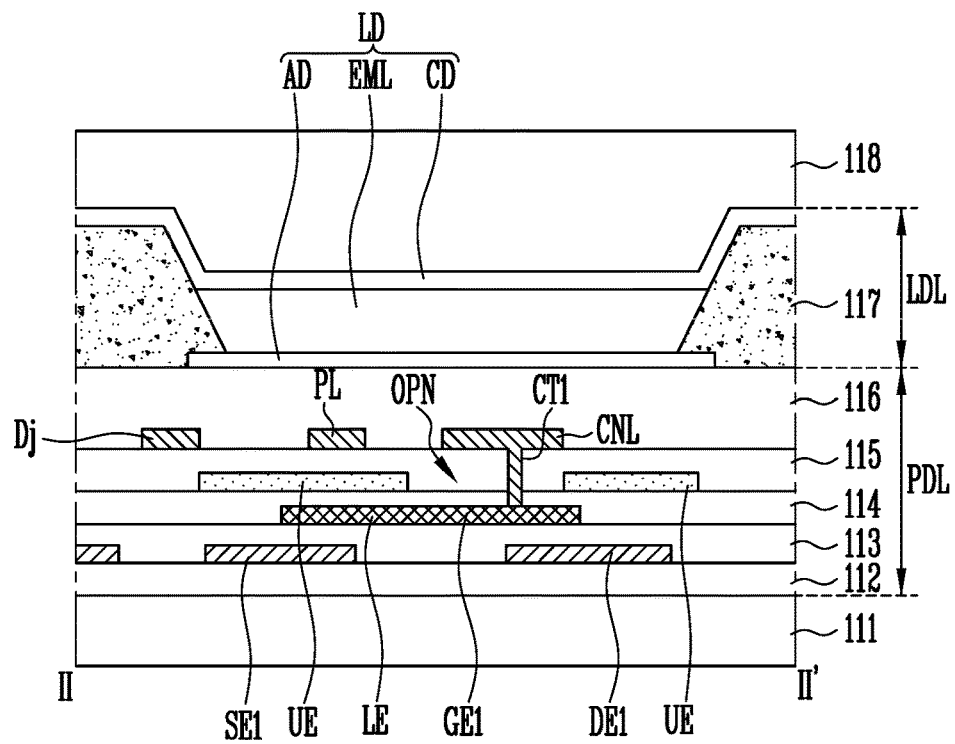
FIG. 10 is a cross-sectional view taken along a line II-II' of FIG. 8.

FIG. 8 is a plan view illustrating a layout of the pixel shown in FIG. 7 according to some example embodiments. For example, FIG. 8 shows an example layout of any pixel PXL located in the display area AA of FIGS. 1 and 2. For example, FIG. 8 is a diagram showing the layout of the pixel PXL shown in FIG. 7. FIG. 9 is a cross-sectional view taken along a line I-I' of FIG. 8. FIG. 10 is a cross-sectional view taken along a line II-II' of FIG. 8.

In describing aspects of example embodiments according to FIGS. 8 to 10, for convenience, a scan line of an (i−1)-th row is referred to as an "(i+1)-th scan line (Si+1)", a light emitting control line of an i-th row is referred to as a "light emitting control line Ei", a data line of a j-th column is referred to as a "data line Dj", and a power line of the j-th column, for example, a power line of the j-th column, to which first power ELVDD is applied, is referred to as a "power line PL".

Referring to FIGS. 8 to 10 with FIGS. 1 to 7, the display device 10 may include the pixels PXL located in the display area AA and a wire portion for supplying the driving signals and/or power to the pixels PXL. The wire portion may include the scan lines Si−1, Si, and Si+1, the data line Dj, the light emitting control line Ei, the power line PL, and an initialization power line IPL.

The scan lines Si−1, Si, and Si+1 may extend in a first direction DR1 in the display area AA. The scan lines Si−1, Si, and Si+1 may include the (i−1)-th scan line Si−1, the i-th scan line Si, and the (i+1)-th scan line Si+1 that are sequentially arranged along a second direction DR2 intersecting the first direction DR1. The scan lines Si−1, Si, and Si+1 may receive scan signals. For example, the (i+1)-th scan line Si−1 may receive an (i−1)-th scan signal, the i-th scan line Si may receive an i-th scan signal, and the (i+1)-th scan line Si+1 may receive an (i+1)-th scan signal.

The light emitting control line Ei may extend in the first direction DR1 so as to be parallel to the scan lines Si−1, Si, and Si+1 in the display area AA. The light emitting control line Ei may receive a light emitting control signal.

The data line Dj may extend in the second direction DR2 in the display area AA. That is, the data line Dj may extend in a direction intersecting control lines Si−1, Si, Si+1, and Ei including the scan lines Si−1, Si, and Si+1 and the light emitting control line Ei. The data line Dj may receive a data signal.

The power line PL may extend along the second direction DR2 in the display area AA, but is not limited thereto. The power line PL may be arranged to be spaced apart from the data line Dj and may receive the first power ELVDD.

The initialization power line IPL may extend along the first direction DR1 in the display area AA, but is not limited thereto. The initialization power line IPL may receive the initialization power Vint.

According to some example embodiments of the disclosure, the pixel PXL may include the first to seventh transistors M1 to M7, the storage capacitor Cst, and the light emitting element LD.

The first transistor M1 may include a first gate electrode GE1, a first source electrode SE1, and a first drain electrode DE1.

According to some example embodiments, the first gate electrode GE1 may be arranged so as to overlap a first channel CH1 of the active pattern ACT, with at least one insulating layer, for example the gate insulating layer 113 interposed therebetween. The first gate electrode GE1 may be connected to a third drain electrode DE3 (including DE3a and DE3b) of the third transistor M3 and a fourth source electrode SE4 (including SE4a and SE4b) of the fourth transistor M4.

The first gate electrode GE1 may be connected to the third drain electrode DE3 and the fourth source electrode SE4 by the connection wire CNL. One end of the connection line CNL may be connected to the first gate electrode GE1 through a first contact hole CT1 and the other end may be connected to the third drain electrode DE3 and the fourth source electrode SE4 through a second contact hole CT2.

According to some example embodiments of the disclosure, the first channel CH1, the first source electrode SE1, and the first drain electrode DE1 may be formed of a semiconductor pattern in which an impurity is not doped or an impurity is doped. For example, the first source electrode SE1 and the first drain electrode DE1 may be formed of a semiconductor pattern doped with an impurity, and the first channel CH1 may be formed of a semiconductor pattern in which an impurity is not doped.

The first channel CH1 has a shape extending in an arbitrary direction and may have a shape bent several times along the extended longitudinal direction. The first channel CH1 may overlap the first gate electrode GE1 when viewed in a plan view. A channel region of the first transistor M1 may be formed to be long by forming the first channel CH1 to be long. Therefore, a driving range of a gate voltage applied to the first transistor M1 is widened. Thus, a grayscale of the light emitted from the light emitting element LD may be finely controlled.

The first source electrode SE1 may be connected to one end of the first channel CH1. The first source electrode SE1 may be connected to a second drain electrode DE2 of the second transistor M2 and a fifth drain electrode DE5 of the fifth transistor M5. According to some example embodiments, the first drain electrode DE1 may be connected to the other end of the first channel CH1. The first drain electrode DE1 may be connected to a third source electrode SE3 of the third transistor M3 and a sixth source electrode SE6 of the sixth transistor M6.

The second transistor M2 may include a second gate electrode GE2, a second channel CH2, a second source electrode SE2, and a second drain electrode DE2.

The second gate electrode GE2 may be arranged so as to overlap a second channel CH2, with at least one insulating layer, for example, the gate insulating layer 113 interposed therebetween. The second gate electrode GE2 may be connected to the i-th scan line Si.

The second channel CH2, the second source electrode SE2, and the second drain electrode DE2 may be formed of a semiconductor pattern in which an impurity is not doped or an impurity is doped. For example, the second source electrode SE2 and the second drain electrode DE2 may be formed of a semiconductor pattern in which an impurity is doped, and the second channel CH2 may be formed of a semiconductor pattern in which an impurity is not doped. The second channel CH2 may correspond to a portion overlapping the second gate electrode GE2.

One end of the second source electrode SE2 may be connected to the second channel CH2 and the other end of the second source electrode SE2 may be connected to the data line Dj through a sixth contact hole CT6. According to some example embodiments, one end of the second drain electrode DE2 may be connected to the second channel CH2 and the other end of the second drain electrode DE2 may be connected to the first source electrode SE1 of the first transistor M1 and the fifth drain electrode DE5 of the fifth transistor M5.

The third transistor M3 may be provided with a double gate structure to prevent or reduce a leakage current. That is, the third transistor M3 may include 3$a$-th transistor M3$a$ and a 3$b$-th transistor M3$b$. The 3$a$-th transistor M3$a$ may include a 3$a$-th gate electrode GE3$a$, a 3$a$-th active pattern ACT3$a$, a 3$a$-th source electrode SE3$a$, and a 3$a$-th drain electrode DE3$a$. The 3$b$-th transistor M3$b$ may include a 3$b$-th gate electrode GE3$b$, a 3$b$-th active pattern ACT3$b$, a 3$b$-th source electrode SE3$b$, and a 3$b$-th drain electrode DE3$b$. Hereinafter, the 3$a$-th gate electrode GE3$a$ and the 3$b$-th gate electrode GE3$b$ are referred to as a third gate electrode GE3, the 3$a$-th active pattern ACT3$a$ and the 3$b$-th active pattern ACT3$b$ are referred to as a third channel CH3, the 3$a$-th source electrode SE3$a$ and the 3$b$-th source electrode SE3$b$ are referred to as a third source electrode SE3, and the 3$a$-th drain electrode DE3$a$ and the 3$b$-th drain electrode DE3$b$ are referred to as a third drain electrode DE3.

The third gate electrode GE3 may be arranged so as to overlap a third channel CH3, with at least one insulating layer, for example, the gate insulating layer 113 interposed therebetween. The third gate electrode GE3 may be connected to the i-th scan line Si.

The third channel CH3, the third source electrode SE3, and the third drain electrode DE3 may be formed of a semiconductor pattern in which an impurity is not doped or the impurity is doped. For example, the third source electrode SE3 and the third drain electrode DE3 may be formed of a semiconductor pattern in which an impurity is doped, and the third channel CH3 may be formed of a semiconductor pattern in which an impurity is not doped. The third channel CH3 corresponds to a portion overlapping the third gate electrode GE3.

One end of the third source electrode SE3 may be connected to the third channel CH3 and the other end of the third source electrode SE3 may be connected to the first drain electrode DE1 of the first transistor M1 and the sixth source electrode SE6 of the sixth transistor M6. According to some example embodiments, one end of the third drain electrode DE3 may be connected to the third channel CH3 and the other end of the third drain electrode DE3 may be connected to the fourth source electrode SE4 of the fourth transistor M4. In addition, the third drain electrode DE3 may be connected to the first gate electrode GE1 of the first transistor M1 through the connection line CNL, the second contact hole CT2, and the first contact hole CT1.

The fourth transistor M4 may be provided with a double gate structure to prevent or reduce a leakage current. That is, the fourth transistor M4 may include 4$a$-th transistor M4$a$ and a 4$b$-th transistor M4$b$. The 4$a$-th transistor M4$a$ may include a 4$a$-th gate electrode GE4$a$, a 4$a$-th active pattern ACT4$a$, a 4$a$-th source electrode SE4$a$, and a 4$a$-th drain electrode DE4$a$. The 4$b$-th transistor M4$b$ may include a 4$b$-th gate electrode GE4$b$, a 4$b$-th active pattern ACT4$b$, a 4$b$-th source electrode SE4$b$, and a 4$b$-th drain electrode DE4$b$. Hereinafter, the 4$a$-th gate electrode GE4$a$ and the 4$b$-th gate electrode GE4$b$ are referred to as a fourth gate electrode GE4, the 4$a$-th active pattern ACT4$a$ and the 4$b$-th active pattern ACT4$b$ are referred to as a fourth channel CH4, the 4$a$-th source electrode SE4$a$ and the 4$b$-th source electrode SE4$b$ are referred to as a fourth source electrode SE4, and the 4$a$-th drain electrode DE4$a$ and the 4$b$-th drain electrode DE4$b$ are referred to as a fourth drain electrode DE4.

The fourth gate electrode GE4 may be arranged so as to overlap a fourth channel CH4, with at least one insulating layer, for example, the gate insulating layer 114 interposed therebetween. The fourth gate electrode GE4 may be connected to the (i−1)-th scan line Si−1.

The fourth channel CH4, the fourth source electrode SE4, and the fourth drain electrode DE4 may be formed of a semiconductor pattern in which an impurity is not doped or an impurity is doped. For example, the fourth source electrode SE4 and the fourth drain electrode DE4 may be formed of a semiconductor pattern in which an impurity is doped, and the fourth channel CH4 may be formed of a semiconductor pattern in which an impurity is not doped. The fourth channel CH4 corresponds to a portion overlapping the fourth gate electrode GE4.

One end of the fourth source electrode SE4 may be connected to the fourth channel CH4 and the other end of the fourth source electrode SE4 may be connected to the third drain electrode DE3 of the third transistor M3. In addition, the fourth source electrode SE4 may be connected to the first gate electrode GE1 of the first transistor M1 through the connection line CNL, the second contact hole CT2, and the first contact hole CT1. One end of the fourth drain electrode DE4 may be connected to the fourth channel CH4 and the other end of the fourth drain electrode DE4 may be connected to a seventh drain electrode DE7 of the seventh transistor M7 of the pixel PXL of the (i−1)-th row. The fourth drain electrode DE4 may be connected to the initialization power line IPL through an auxiliary connection wire AUX, a ninth contact hole CT9, and an eighth contact hole CT8.

The fifth transistor M5 may include a fifth gate electrode GE5, a fifth channel CH5, a fifth source electrode SE5, and a fifth drain electrode DE5.

The fifth gate electrode GE5 may be arranged so as to overlap the fifth channel CH5, with at least one insulating layer, for example, the gate insulating layer 113 interposed therebetween. The fifth gate electrode GE5 may be connected to the light emitting control line Ei.

The fifth channel CH5, the fifth source electrode SE5, and the fifth drain electrode DE5 may be formed of a semiconductor pattern in which an impurity is not doped or an impurity is doped. For example, the fifth source electrode SE5 and the fifth drain electrode DE5 may be formed of a semiconductor pattern in which an impurity is doped, and the fifth channel CH5 may be formed of a semiconductor pattern in which an impurity is not doped. The fifth channel CH5 corresponds to a portion overlapping the fifth gate electrode GE5.

One end of the fifth source electrode SE5 may be connected to the fifth channel CH5 and the other end of the fifth source electrode SE5 may be connected to the power line PL through a fifth contact hole CT5. According to some example embodiments, one end of the fifth drain electrode DE5 may be connected to the fifth channel CH5 and the other end of the fifth drain electrode DE5 may be connected to the first source electrode SE1 of the first transistor M1 and the second drain electrode DE2 of the second transistor M2.

The sixth transistor M6 may include a sixth gate electrode GE6, a sixth channel CH6, the sixth source electrode SE6, and a sixth drain electrode DE6.

The sixth gate electrode GE6 may be arranged so as to overlap the sixth channel CH6, with at least one insulating layer, for example, the gate insulating layer 113 interposed therebetween. The sixth gate electrode GE6 may be connected to the light emitting control line Ei.

The sixth channel CH6, the sixth source electrode SE6, and the sixth drain electrode DE6 are formed of a semiconductor pattern in which an impurity is not doped or an impurity is doped. For example, the sixth source electrode SE6 and the sixth drain electrode DE6 may be formed of a semiconductor pattern in which an impurity is doped, and the sixth channel CH6 may be formed of a semiconductor pattern in which an impurity is not doped. The sixth channel CH6 corresponds to a portion overlapping the sixth gate electrode GE6.

One end of the sixth source electrode SE6 may be connected to the sixth channel CH6 and the other end of the sixth source electrode SE6 may be connected to the first drain electrode DE1 of the first transistor M1 and the third source electrode SE3 of the third transistor M3. According to some example embodiments, one end of the sixth drain electrode DE6 may be connected to the sixth channel CH6 and the other end of the sixth drain electrode DE6 may be connected to the seventh source electrode SE7 of the seventh transistor M7.

The seventh transistor M7 may include a seventh gate electrode GE7, a seventh channel CH7, the seventh source electrode SE7, and the seventh drain electrode DE7.

The seventh gate electrode GE7 may be arranged so as to overlap the seventh channel CH7, with at least one insulating layer, for example, the gate insulating layer 113 interposed therebetween. The seventh gate electrode GE7 may be connected to the (i+1)-th scan line Si+1.

The seventh channel CH7, the seventh source electrode SE7, and the seventh drain electrode DE7 may be formed of a semiconductor pattern in which an impurity is not doped or an impurity is doped. For example, the seventh source electrode SE7 and the seventh drain electrode DE7 may be formed of a semiconductor pattern doped in which an impurity is doped, and the seventh channel CH7 may be formed of a semiconductor pattern in which an impurity is not doped. The seventh channel CH7 corresponds to a portion overlapping the seventh gate electrode GE7.

One end of the seventh source electrode SE7 may be connected to the seventh channel CH7 and the other end of the seventh source electrode SE7 may be connected to the sixth drain electrode DE6 of the sixth transistor M6. According to some example embodiments, one end of the seventh drain electrode DE7 may be connected to the seventh channel CH7 and the other end of the seventh drain electrode DE7 may be connected to the initialization power line IPL through the auxiliary connection wire AUX, the ninth contact hole CT9, and the eighth contact hole CT8.

The storage capacitor Cst may include a first capacitor electrode LE and a second capacitor electrode UE. According to some example embodiments, the first capacitor electrode LE may be a lower electrode of the storage capacitor Cst and may be formed integrally with the first gate electrode GE1 of the first transistor M1. According to some example embodiments, the second capacitor electrode UE may be an upper electrode of the storage capacitor Cst and may overlap the first gate electrode GE1. In addition, as viewed in plan view, the second capacitor electrode UE may cover at least one area of the first capacitor electrode LE. A capacitance of the storage capacitor Cst may be increased by enlarging the overlapping area of the first capacitor electrode LE and the second capacitor electrode UE.

The second capacitor electrode UE may extend in the first direction DR1. According to some example embodiments of the disclosure, a voltage of the same level as that of the first power ELVDD may be applied to the second capacitor electrode UE. The second capacitor electrode UE may have an opening portion OPN in an area where the first contact hole CT1 in which the first gate electrode GE1 and the connection wire CNL are in contact is formed.

The light emitting element LD may include the first electrode (for example, the anode electrode) AD, the second electrode (for example, the cathode electrode) CD, and the light emitting layer EML provided between the first electrode AD and the second electrode CD. According to some example embodiments, the first electrode AD and the second electrode CD are arranged to overlap with each other in the light emitting area LA of the light emitting element layer LDL and the light emitting layer EML may be formed in the light emitting area LA. That is, the light emitting area LA of each pixel PXL may be an area where the first electrode AD, the light emitting layer EML, and the second electrode CD of the light emitting element LD overlap each other.

The first electrode AD may be provided in a light emitting area (e.g., a predetermined light emitting area) LA. The first electrode AD may be connected to the seventh source electrode SE7 of the seventh transistor M7 and the sixth drain electrode DE6 of the sixth transistor M6 through the fourth contact hole CT4 and the seventh contact hole CT7. The bridge pattern BRP may be provided between the fourth contact hole CT4 and the seventh contact hole CT7. The bridge pattern BRP may connect the sixth drain electrode DE6, the seventh source electrode SE7, and the first electrode AD.

Hereinafter, a stack structure (sectional structure) of a pixel PXL and a display area AA including the pixel PXL according to some example embodiments of the disclosure will be described.

First, the buffer layer 112 may be provided on the first surface of the first substrate 111.

The active patterns (ACT1 to ACT7; hereinafter, 'ACT') may be provided on the buffer layer 112. According to some example embodiments, the active patterns ACT may include the first to seventh channels CH1 to CH7. The first to seventh channels CH1 to CH7 may be formed of a semiconductor material.

The gate insulating layer 113 may be provided on the buffer layer 112 on which the first to seventh channels CH1 to CH7 are provided. According to some example embodiments, the gate insulating layer 113 may be a gate insulating film interposed between the active patterns ACT1 to ACT7 and the gate electrodes GE1 to GE7 of the transistors M1 to M7 included in the pixels PXL.

The gate insulating layer 113 may include at least one inorganic film and/or organic film. For example, the gate insulating layer 113 may be formed of an inorganic film including SiOx, SiNx, or the like, but is not limited thereto. For example, the gate insulating layer 113 may include an inorganic insulating material or an organic insulating material such as SiOx, SiNx, SiON, SiOF, or AlOx, and may be a single film or a multiple film including at least one of these materials.

According to some example embodiments of the disclosure, the gate insulating layer 113 may have a limited thickness of a range (e.g., a predetermined range) so as to easily drive the transistors M1 to M7. For example, the gate insulating layer 113 may have a thickness of about 1000 Å to 1500 Å, for example, about 1200 Å, but the thickness of the gate insulating layer 113 is not limited thereto.

A first conductive layer may be located on the gate insulating layer 113. According to some example embodiments, the first conductive layer may be a first gate layer. The first conductive layer may be provided with the control lines Si−1, Si, Si+1, and Ei and the gate electrodes GE1 to GE7. In addition, one electrode of the storage capacitor Cst, for example, the first capacitor electrode LE may be provided on the first conductive layer. Specifically, the (i−1)-th scan line Si−1, the i-th scan line Si, the (i+1)-th scan line Si+1, the light emitting control line Ei, and the first to seventh gate electrodes GE1 to GE7 may be provided. According to some example embodiments, the first gate electrode GE1 may also be the first capacitor electrode LE of the storage capacitor Cst. That is, the first gate electrode GE1 and the first capacitor electrode LE may be integrally formed.

The control lines Si−1, Si, Si+1, and Ei, the gate electrodes GE1 to GE7, and/or the first capacitor electrode LE that is the lower electrode of the storage capacitor Cst located on the first conductive layer may be configured of the same material. For example, the control lines Si−1, Si, Si+1, and Ei, the gate electrodes GE1 to GE7, and/or the first capacitor electrode LE of the storage capacitor Cst may be formed of a first gate metal (e.g., a predetermined first gate metal).

Examples of a material capable of configuring the first gate metal may include Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, Pb, and the like, and other various metals may be used as the material capable of configuring the first gate metal. Examples of an alloy capable of configuring the first gate metal may include may include MoTi, AlNiLa, and the like, and other various alloys may be used as the alloy capable of configuring the first gate metal. Examples of a multilayer film capable of configuring the first gate metal may include Ti/Cu, Ti/Au, Mo/Al/Mo, ITO/Ag/ITO, TiN/Ti/Al/Ti, TiN/Ti/Cu/Ti, and the like, and other various conductive materials of a multilayer film structure may be used as the multilayer film capable of configuring the first gate metal.

On the other hand, the configuration material of the control lines Si−1, Si, Si+1, and Ei, the gate electrodes GE1 to GE7, and/or the first capacitor electrode LE is not necessarily limited to metal. That is, a material capable of providing conductivity enough to smoothly drive the pixels PXL may be used as the material configuring the control lines Si−1, Si, Si+1, and Ei, the gate electrodes GE1 to GE7, and/or the first capacitor electrode LE.

For example, the control lines Si−1, Si, Si+1, and Ei, the gate electrodes GE1 to GE7, and/or the first capacitor electrode LE may be configured of a conductive polymer or a conductive metal oxide. Examples of the conductive polymer capable of configuring the control lines Si−1, Si, Si+1, and Ei, the gate electrodes GE1 to GE7, and/or the first capacitor electrode LE may include polythiophene based compound, polypyrrole based compound, polyaniline based compound, polyacetylene based compound, polyphenylene based compound, mixtures thereof, and the like, and particularly, among the polythiophene based compound compounds, PEDOT/PSS compound may be used. Examples of the conductive metal oxide capable of configuring the control lines Si−1, Si, Si+1, and Ei, the gate electrodes GE1 to GE7, and/or the first capacitor electrode LE may include ITO, IZO, AZO, ITZO, ZnO, SnO2, and the like.

The first insulating interlayer 114 may be provided on the first conductive layer. According to some example embodiments, the first insulating interlayer 114 may be a first interlayer insulating film interposed between the first capacitor electrode LE and the second capacitor electrode UE. According to some example embodiments, the first insulating interlayer 114 may have a thickness limited to a range (e.g., a predetermined range) in order to sufficiently secure a capacity of the storage capacitor Cst within a limited area. According to some example embodiments, the first insulating interlayer 114 may have a thickness similar to that of the gate insulating layer 113. For example, the first insulating interlayer 114 may have a thickness of about 1000 Å to 1500 Å, for example, about 1400 Å, but the thickness of the first insulating interlayer 114 is not limited thereto.

The first insulating interlayer 114 may include one or more inorganic films and/or organic films. For example, the first insulating interlayer 114 may be configured of an inorganic film including SiOx, SiNx, or the like, but is not limited thereto. For example, the first insulating interlayer 114 may include an inorganic insulating material or an organic insulating material such as SiOx, SiNx, SiON, SiOF, or AlOx, and may be a single film or a multilayer film including at least one of these materials.

The second conductive layer may be arranged on the first insulating interlayer 114. According to some example embodiments, the second conductive layer may be a second gate layer.

The second conductive layer may be provided with the second capacitor electrode UE and the initialization power line IPL. According to some example embodiments, the second capacitor electrode UE may cover the first capacitor electrode LE. The second capacitor electrode UE overlaps the first capacitor electrode LE, with the first insulating interlayer 114 interposed therebetween to form the storage capacitor Cst together with the first capacitor electrode LE.

The second capacitor electrode UE and the initialization power line IPL arranged in the second conductive layer may be configured of the same material. For example, the second capacitor electrode UE and the initialization power line IPL may be formed of a second gate metal (e.g., a predetermined second gate metal). According to some example embodiments, the second gate metal may be one of the metal materials previously presented as the example of the first gate metal, but is not limited thereto. In addition, the configuration material of the second capacitor electrode UE and the initialization power line IPL arranged in the second conductive layer is not necessarily limited to metal. That is, a material capable of providing conductivity enough to smoothly drive the pixels PXL may be used as the material configuring the second capacitor electrode UE and the initialization power line IPL. For example, the second capacitor electrode UE and the initialization power line IPL arranged on the second conductive layer may be configured of a conductive polymer or a conductive metal oxide.

The second insulating interlayer 115 may be provided on the second conductive layer. According to some example embodiments, the second insulating interlayer 115 may be a second interlayer insulating film. The second insulating interlayer 115 may have a thickness greater than that of the gate insulating layer 113 and the first insulating interlayer 114. For example, the thickness of the second insulating interlayer 115 may be equal to or greater than a sum of the thickness of the gate insulating layer 113 and the thickness of the first insulating interlayer 114. For example, the second insulating interlayer 115 may have a thickness of about 5000 Å, but the thickness of the second insulating interlayer 115 is not limited thereto. When the second insulating interlayer 115 is formed to have a sufficient thickness that is greater than the sum of the thickness of the gate insulating layer 113 and the thickness of the first insulating interlayer 114 as described above, electrical stability between components located above and under the second insulating interlayer 115 may be secured. Therefore, instances of a short circuit defect may be effectively prevented or reduced.

The second insulating interlayer 115 may include one or more inorganic films and/or organic films. For example, the second insulating interlayer 115 may be configured of an inorganic film including SiOx, SiNx, or the like, but is not limited thereto. For example, the second insulating interlayer 115 may include an inorganic insulating material or an organic insulating material such as SiOx, SiNx, SiON, SiOF, or AlOx, and may be a single film or multiple film including at least one of these materials.

A third conductive layer may be arranged on the second insulating interlayer 115. According to some example embodiments, the third conductive layer may be a source-drain layer.

The third conductive layer may be provided with the data line Dj, the power line PL, the connection wire CNL, the bridge pattern BRP, and the auxiliary connection wire AUX.

The data line Dj may be electrically connected to the second source electrode SE2 through the sixth contact hole CT6 passing through the gate insulating layer 113, the first insulating interlayer 114, and the second insulating interlayer 115.

The power line PL may be connected to the second capacitor electrode UE that is the upper electrode of the storage capacitor Cst through the third contact hole CT3 passing through the second insulating interlayer 115. In addition, the power line PL may be connected to the fifth source electrode SE5 through the fifth contact hole CT5 passing through the gate insulating layer 113, the first insulating interlayer 114, and the second insulating interlayer 115.

The connection wire CNL may be connected to the first gate electrode GE1 through the first contact hole CT1 passing through the first insulating interlayer 114 and the second insulating interlayer 115. In addition, the connection wire CNL may be electrically connected to the third drain electrode DE3 and the fourth source electrode SE4 through the second contact hole CT2 passing through the gate insulating layer 113, the first insulating interlayer 114, and the second insulating interlayer 115.

The bridge pattern BRP may be a pattern provided as a medium connecting the sixth drain electrode DE6 and the first electrode AD between the sixth drain electrode DE6 and the first electrode AD. This bridge pattern BRP may be electrically connected to the sixth drain electrode DE6 and the seventh source electrode SE7 through the fourth contact hole CT4 passing through the gate insulating layer 113, the first insulating interlayer 114, and the second insulating interlayer 115.

The auxiliary connection wire AUX may be connected to the initialization power line IPL through the eighth contact hole CT8 passing through the second insulating interlayer 115. In addition, the auxiliary connection wire AUX may be connected to the seventh drain electrode DE7 through the ninth contact hole CT9 passing through the gate insulating layer 113, the first insulating interlayer 114, and the second insulating interlayer 115.

The data line Dj, the power line PL, the connection wire CNL, the bridge pattern BRP and/or the auxiliary connection wire AUX arranged in the third conductive layer may be configured of the same material. For example, the data line Dj, the power line PL, the connection wire CNL, the bridge pattern BRP and/or the auxiliary connection wire AUX may be formed of a source drain metal (e.g., a predetermined source drain metal).

The source drain metal may be one of the metal materials previously presented as the example of the first and/or second gate metal, but is not limited thereto. In addition, the configuration material of the data line Dj, the power line PL, the connection wire CNL, the bridge pattern BRP and/or the auxiliary connection wire AUX, which are arranged in the third conductive layer, is not necessarily limited to metal. That is, a material capable of providing conductivity enough to smoothly drive the pixels PXL may be used as the material configuring the data line Dj, the power line PL, the connection wire CNL, the bridge pattern BRP and/or the auxiliary connection wire AUX. For example, the data line Dj, the power line PL, the connection wire CNL, the bridge pattern BRP and/or the auxiliary connection wire AUX may be configured of a conductive polymer or a conductive metal oxide.

At least two of the first gate metal, the second gate metal, and the source drain metal may be formed of the same material. For example, the first gate metal and the second gate metal may be formed of the same material even though the first gate metal and the second gate metal are arranged on different layers. However, the disclosure is not limited thereto. For example, according to some example embodiments, all of the first gate metal, the second gate metal, and the source drain metal may be formed of different materials.

The protective layer 116 may be provided on the third conductive layer. According to some example embodiments, the protective layer 116 may include a passivation film and/or a planarization film. The protective layer 116 may include a seventh contact hole CT7 exposing a portion of the bridge pattern BRP.

The light emitting element LD may be provided on the protective layer 116. The light emitting element LD may include the first electrode AD, the second electrode CD, and the light emitting layer EML provided between the first and second electrodes AD and CD.

At least one of the first electrode AD or the second electrode CD may be a transmissive electrode. For example, when the light emitting element LD is a back surface light emitting type organic light emitting display element, the first electrode AD may be a transmissive electrode and the second electrode CD may be a reflective electrode. On the other hand, when the light emitting element LD is a front surface light emitting type organic light emitting display element, the first electrode may be a reflective electrode and the second electrode may be a transmissive electrode. In addition, when the light emitting element LD is a both surface light emitting type organic light emitting display element, both of the first electrode AD and the second electrode CD may be transmissive electrodes. Hereinafter, a case where the light emitting element LD is a front surface light emitting type organic light emitting display element and the first electrode AD is an anode electrode will be described as an example. In addition, in the present embodiment, the light emitting element LD is used as a light source, but the disclosure is not limited thereto. For example, the light emitting element LD may be replaced with another type of light emitting element.

The first electrode AD may be provided on the protective layer 116. The first electrode AD may be connected to the bridge pattern BRP through the seventh contact hole CT7 passing through the passivation layer 116. Since the bridge pattern BRP is connected to the sixth drain electrode DE6 and the seventh source electrode SE7 through the fourth contact hole CT4, the first electrode AD may be finally connected to the sixth drain electrode DE6 and the seventh source electrode SE7 through the bridge pattern BRP.

The first electrode AD may include a reflective film capable of reflecting light, and a transparent conductive film arranged above or under the reflective film. At least one of the transparent conductive film or the reflective film may be connected to the sixth drain electrode DE6 and the seventh source electrode SE7.

The reflective film may include a material capable of reflecting light. For example, the reflective film may include at least one of aluminum (Al), silver (Ag), chromium (Cr), molybdenum (Mo), platinum (Pt), nickel (Ni), or an alloy thereof.

The transparent conductive film may include a transparent conductive oxide. For example, the transparent conductive film may include at least one transparent conductive oxide among indium tin oxide ("ITO"), indium zinc oxide ("IZO"), aluminum zinc oxide ("AZO"), gallium doped zinc oxide ("GZO"), zinc tin oxide ("ZTO"), gallium tin oxide ("GTO"), and fluorine doped tin oxide ("FTO").

The light emitting layer EML may be arranged on an exposed surface of the first electrode AD. The light emitting layer EML may have a multilayer thin film structure including a light generation layer ("LGL"). For example, the light emitting layer EML may include a hole injection layer ("HIL") for injecting holes, a hole transport layer ("HTL") for increasing a hole recombination opportunity by suppressing movement of electrons that are excellent in transportability of holes and are not combined in the light generation layer, the light generation layer for emitting light by recombination of the injected electrons and holes, a hole blocking layer ("HBL") for suppressing the movement of the holes that are not combined in the light generation layer, an electron transport layer ("ETL") for smoothly transporting the electrons to the light generation layer, and/or an electron injection layer ("EIL") for injecting the electrons.

The color of light generated in the light generation layer may be one of red, green, blue, and white, but the disclosure is not limited thereto. For example, the color of light generated in the light generating layer of the light emitting layer EML may be one of magenta, cyan, and yellow.

The hole injection layer, the hole transport layer, the hole blocking layer, the electron transport layer, and the electron injection layer may be a common film connected with each other in adjacent light emitting areas.

The second electrode CD may be a transflective film. For example, the second electrode CD may be a thin film metal layer having a thickness enough to transmit the light emitted from the light emitting layer EML. For example, the second electrode CD may transmit some of the light emitted from the light emitting layer EML and reflect the remains of the light emitted from the light emitting layer EML.

According to some example embodiments, the second electrode CD may include a material having a work function lower than that of the transparent conductive film. For example, the second electrode CD may include at least one molybdenum (Mo), tungsten (W), silver (Ag), magnesium (Mg), aluminum (Al), platinum (Pt), palladium (Pd), nickel (Ni), neodymium (Nd), iridium (Ir), chromium (Cr), lithium (Li), calcium (Ca), and an alloy thereof.

Some of the light emitted from the light emitting layer EML may not transmit the second electrode CD and the light reflected from the second electrode CD may be reflected again in the reflective film. That is, the light emitted from the light emitting layer EML may resonate between the reflective film and the second electrode CD. A light extraction efficiency of the organic light emitting elements LD may be improved by the resonance of the light.

The pixel definition layer (or bank layer) 117 for partitioning the light emitting area of each pixel PXL may be provided on the first substrate 111 on which the first electrode AD and the like are located. The pixel definition layer 117 may expose an upper surface of the first electrode AD and may be protruded from the first substrate 111 along a circumference of each light emitting area LA.

The light emitting area EML may be provided in the light emitting area LA of each pixel PXL surrounded by the pixel definition layer 117 and the second electrode CD may be provided on the light emitting layer EML. One of the first electrode AD and the second electrode CD may be an anode electrode and the other may be a cathode electrode. For example, the first electrode AD may be an anode electrode, and the second electrode CD may be a cathode electrode.

The pixel definition layer 117 may include an organic insulating material. For example, the pixel definition layer 117 may include at least one of polystyrene, polymethylmethacrylate ("PMMA"), polyacrylonitrile ("PAN"), polyamide ("PA"), polyimide ("PI"), polyarylether ("PAE"), heterocyclic polymer, parylene, epoxy, benzocyclobutene ("BCB"), siloxane based resin, or silane based resin.

In various embodiments of the disclosure, the pixel definition layer 117 may include a material that does not transmit light. For example, the pixel definition layer 117 may include carbon or a black pigment. Therefore, the pixel definition layer 117 may reflect light incident from an upper portion to the outside without passing through lower layers.

The encapsulation layer 118 covering the second electrode CD may be provided on the second electrode CD. According to some example embodiments, the encapsulation layer 118 may be replaced with another type of encapsulation film, encapsulation substrate, protective film of at least one layer, or the like.

The encapsulation layer 118 may prevent or reduce instances of oxygen and moisture penetrating into the light emitting element LD. To this end, the encapsulation layer 118 may include an inorganic film. The inorganic film may include at least one of silicon oxide, silicon nitride, silicon oxynitride, aluminum oxide, titanium oxide, zirconium oxide, or tin oxide.

Each of the circuit elements and the wires arranged on the first surface of the first substrate 111 from the buffer layer 112 to the protective layer 116 may configure the circuit element layer PDL of the display device 10 and/or the fingerprint sensor. In addition, the light emitting elements LD arranged in each pixel PXL from the first electrode AD to the second electrode CD and the pixel definition layer 117 arranged between the light emitting elements LD may configure the light emitting element layer LDL of the display device 10 and/or the fingerprint sensor. In addition, the encapsulation layer 118 and the like may be formed to cover at least the light emitting element layer LDL.

Figure 11:
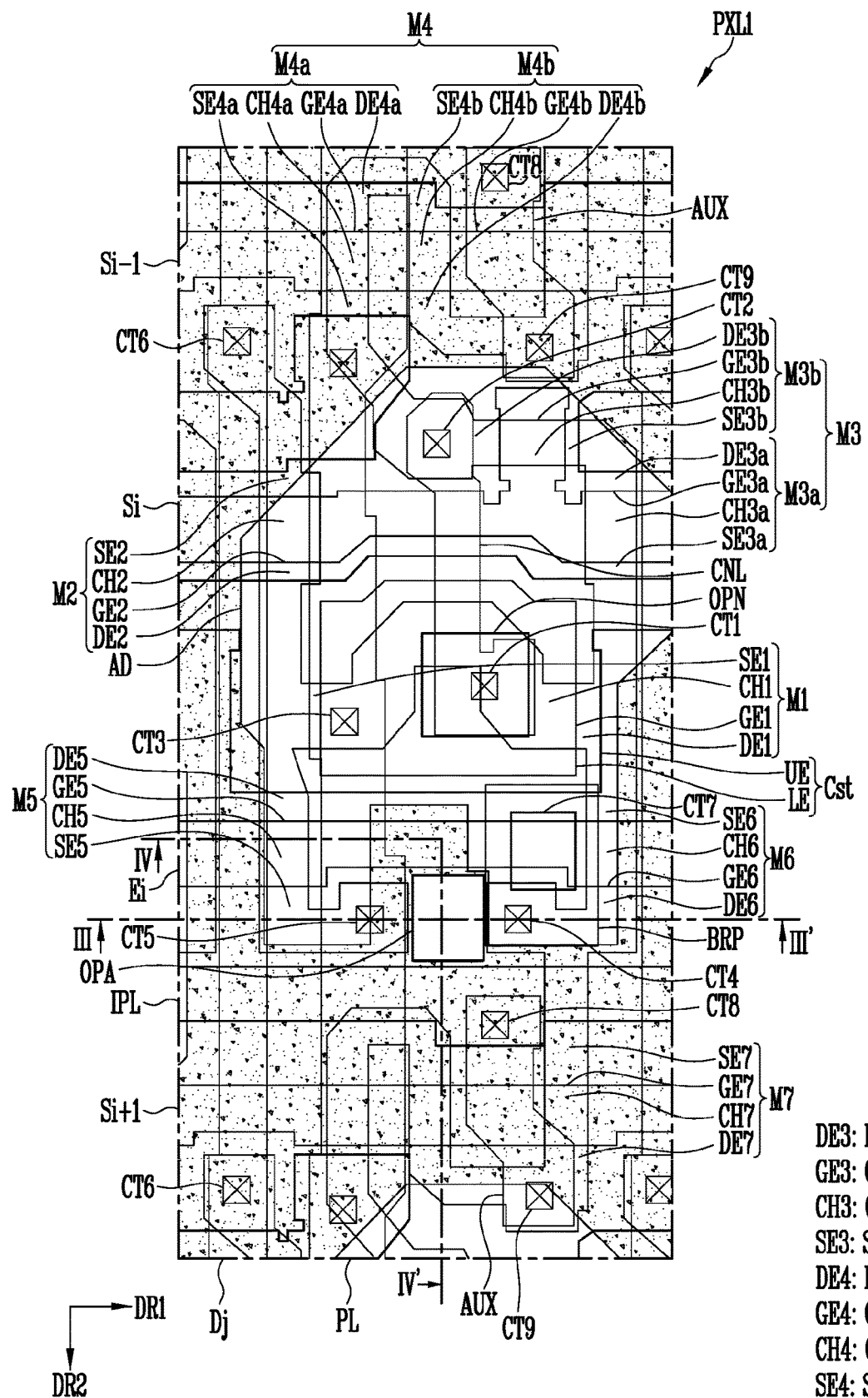
FIG. 11 is a plan view illustrating a layout of a pixel according to some example embodiments of the disclosure.
Figure 12:
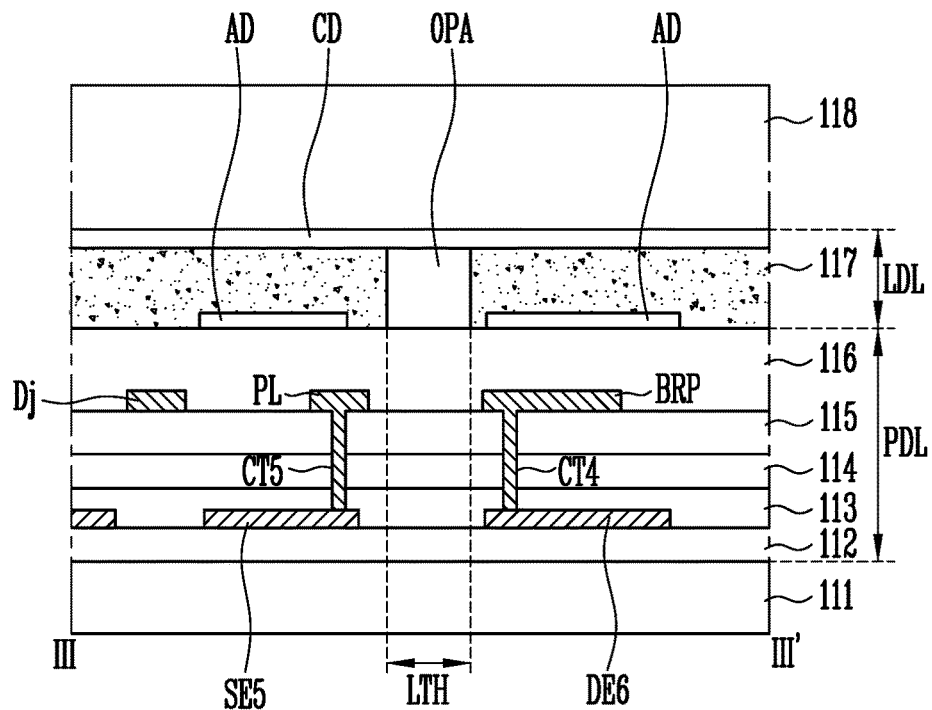
FIG. 12 is a cross-sectional view taken along a line III-III' of FIG. 11.
Figure 13:
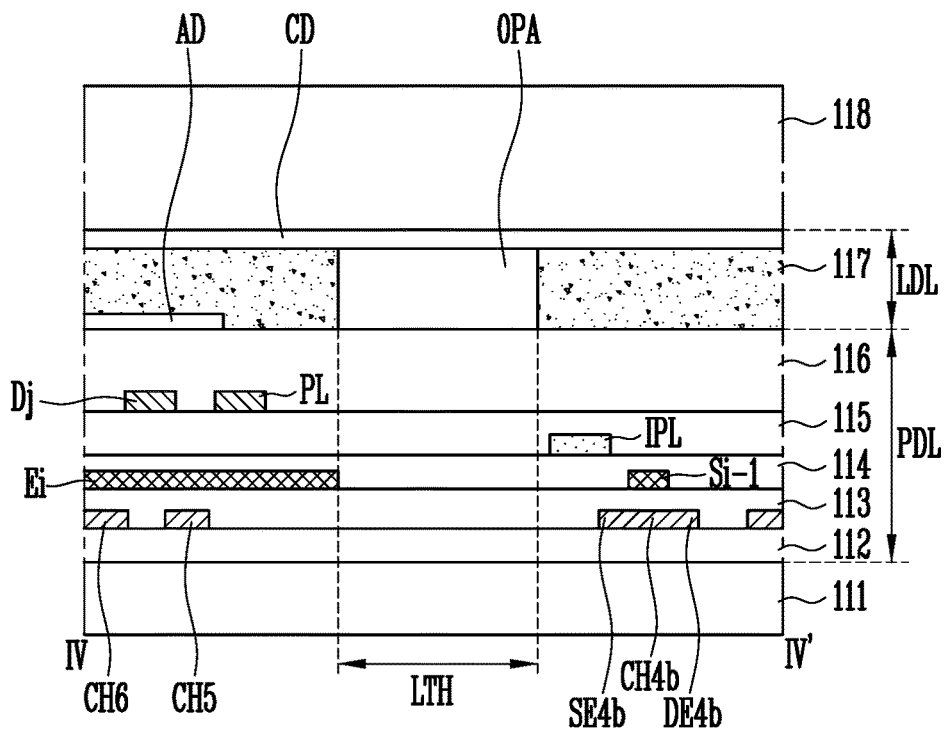
FIG. 13 is a cross-sectional view taken along a line VI-VI' of FIG. 11.

FIG. 11 is a plan view illustrating a layout of a pixel according to some example embodiments of the disclosure. FIG. 12 is a cross-sectional view taken along a line III-III' of FIG. 11. FIG. 13 is a cross-sectional view taken along a line VI-VI' of FIG. 11. In the embodiments according to FIGS. 11 to 13, the same or similar components as those of the embodiments according to FIGS. 8 to 10 are denoted by the same reference numerals, and a detailed description thereof will be omitted.

Specifically, a first pixel PXL1 shown in FIGS. 11 to 13 is an arbitrary pixel that includes at least one light transmission hole LTH in the pixels PXL of the sensing area SA shown in FIGS. 1 and 2 and includes at least one opening portion OPA in a portion of the pixel definition layer 117. That is, according to some example embodiments of the disclosure, at least a part of the pixels PXL of the sensing area SA may include the opening portion OPA formed in the pixel definition layer 117 and the light transmission hole LTH of which at least a portion overlaps the opening portion OPA as the first pixel PXL1 shown in FIGS. 11 and 12.

Referring to FIGS. 11 to 13, the first pixel PXL1 according to some example embodiments of the disclosure may include the light transmission hole LTH formed in at least one conductive layer of the circuit element layer PDL. The sensing area SA may include a plurality of first pixels PXL1 including the light transmission hole LTH.

The light transmission hole LTH may include a multilayer opening portion formed so as to overlap with a plurality of conductive layers configuring the circuit element layer PDL. For example, the light transmission hole LTH may include a multilayer opening portion formed so as to overlap with at least two layers of the semiconductor layer in which the active patterns ACT1 to ACT7 of the circuit element layer PDL are arranged, the first conductive layer in which the gate electrodes GE1 to GE7 are arranged, the second conductive layer in which the second capacitor electrode UE and the like are arranged, the third conductive layer in which the power line PL and the like are arranged, and the third conductive layer in which the bridge pattern BRP and the like are arranged.

According to some example embodiments of the disclosure, the light transmission hole LTH may be arranged in the first pixel PXL1 so that at least a portion of the light transmission hole LTH overlaps the opening portion OPA formed in the pixel definition layer 117. That is, the light transmission hole LTH may be arranged in an area excluding the light emitting area LA of the first pixel PXL1 so as not to overlap the first electrode AD configuring the light emitting element LD.

According to the above-described embodiment, a light transmission hole array for receiving reflection light integrally with the light emitting element layer LDL and the circuit element layer PDL may be formed without forming an additional layer in the circuit element layer PDL. Therefore, the module thickness of the display device 10 may be reduced.

On the other hand, in various embodiments of the disclosure, the structure and the form of the light transmission hole LTH are not limited to those shown in FIGS. 11 to 13. That is, according to some example embodiments, the light transmission hole LTH may be formed in another area, for example, an area including the opening portion OPN formed in the first gate electrode GE1. According to some example embodiments, a layout structure may be variously modified so that the conductive layer is not arranged in the light transmission hole LTH.

Figure 14A:
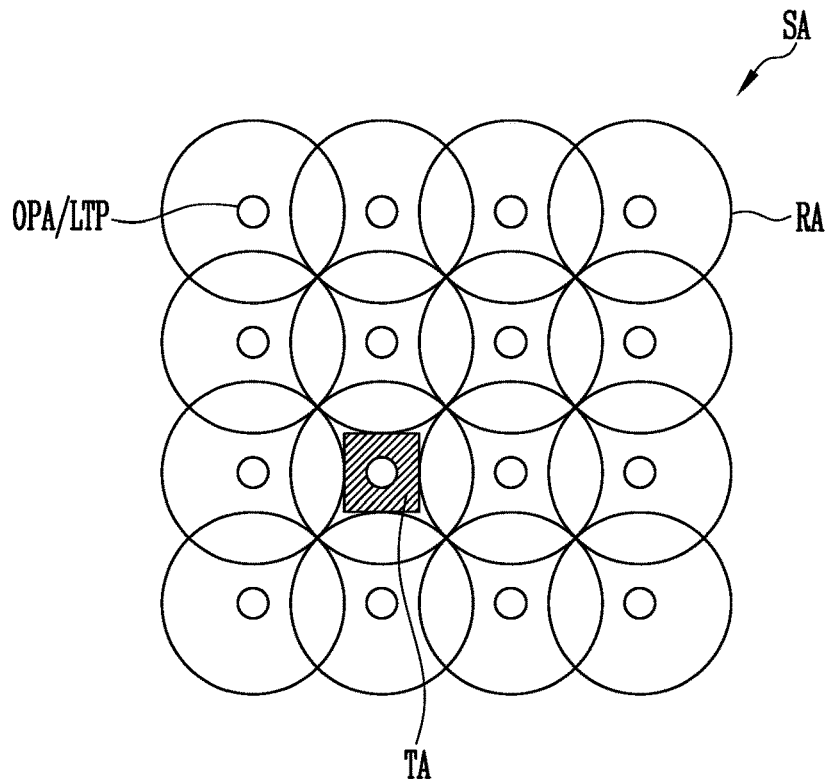
FIGS. 14A to 14C are plan views illustrating opening portions and a structural arrangement of reflection light reach areas corresponding to the opening portions according to some example embodiments of the disclosure.
Figure 14B:
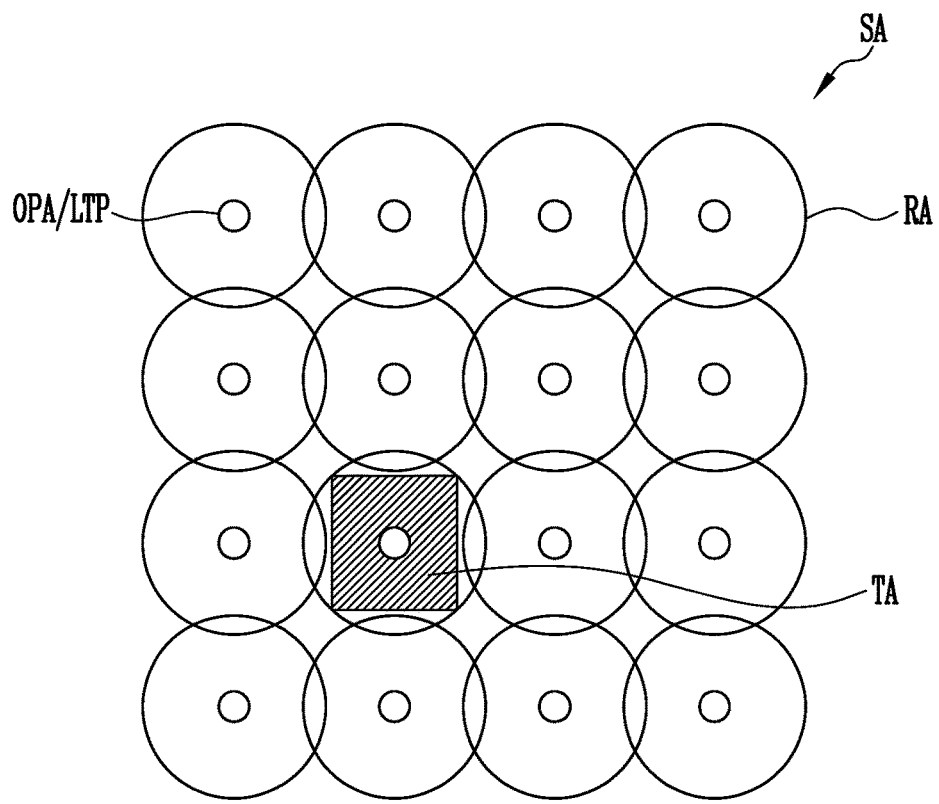
Figure 14C:
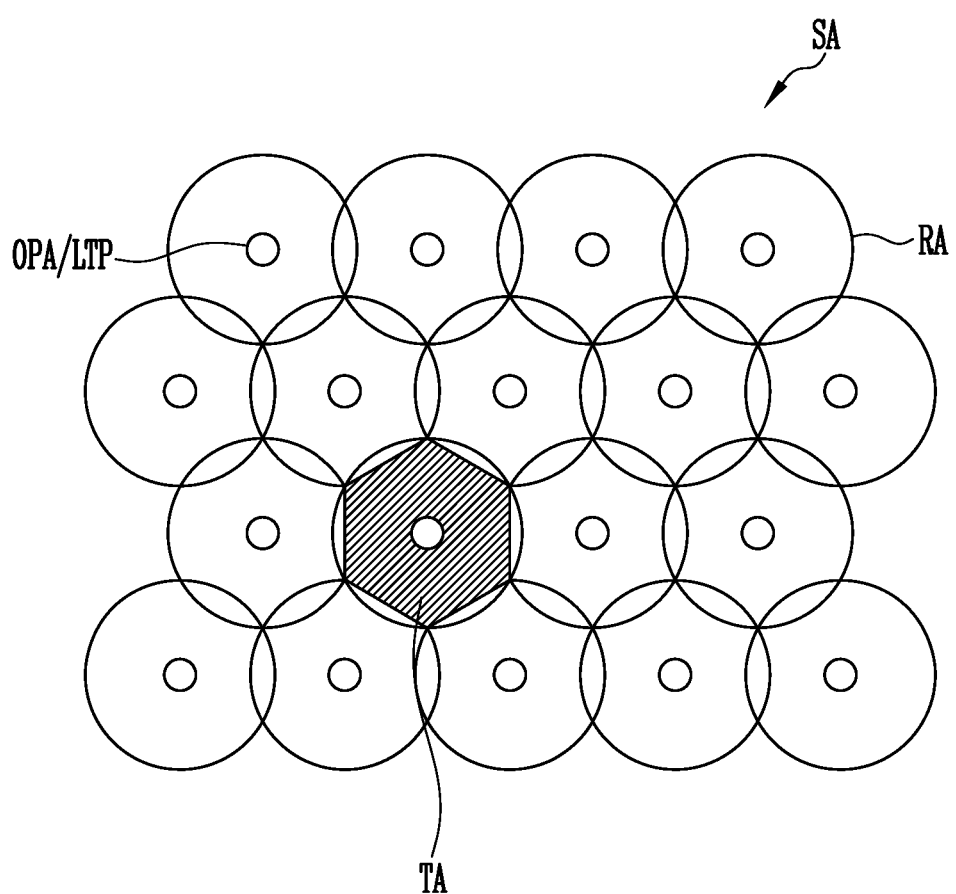

FIGS. 14A to 14C are plan views illustrating various embodiments of opening portions and a relative structural arrangement of reflection light reach areas corresponding to the opening portions.

According to some example embodiments, the opening portions OPA and the light transmission areas LTP may be regularly arranged along the first direction DR1 and the second direction DR2 perpendicular to the first direction DR1 as shown in FIGS. 14A and 14B. In such embodiments, eight adjacent opening portions OPA and light transmission areas LTP may be arranged for any opening portions OPA and light transmission areas LTP, and the adjacent opening portions OPA and light transmission areas LTP may be arranged to form a quadrangle. That is, the adjacent opening portions OPA and light transmission areas LTP may be arranged at each vertex and at each side of the quadrangle.

Alternatively, according to some example embodiments, the opening portions OPA and the light transmission areas LTP may be regularly arranged along the diagonal direction of the first direction DR1 and the second direction DR2 as shown in FIG. 14C. According to some example embodiments, six adjacent opening portions OPA and light transmission areas LTP may be arranged for any opening portions OPA and light transmission areas LTP, and adjacent opening portions OPA and light transmission areas LTP may be arranged to form a hexagon. That is, the adjacent opening portions OPA and light transmission areas LTP may be located at each vertex of the hexagon.

Referring to FIGS. 14A to 14C together with FIGS. 1 to 5, reflection light may be incident on a display surface of the display device 10 by the user's finger that is in contact with or adjacent to the display surface of the display device 10. Some of the reflection light is reflected by the pixel definition layer 117, but the remains of the reflection light may pass through the opening portion OPA and the light transmission area LTP formed in the pixel definition layer 117 to reach the reach area RA.

A size and a shape of the reach area RA may be variously determined by sizes and shapes of the opening portion OPA and the light transmission area LTP, a distance between the opening portions OPA and the light transmission areas LTP, a distance from the opening portion OPA to the light sensor PHS, and the like. At this time, at least a part of the reach areas RA corresponding to the respective opening portions OPA and the light transmission area LTP may overlap according to the distance between the opening portions OPA and the light transmission areas LTP.

In the area where the reach areas RA overlap, since a characteristic of the reflection light may change due to mutual interference, the fingerprint detector 220 may detects the fingerprint using light collected only with respect to an effective area TA in the reach area RA that does not overlap the other reach area RA.

According to some example embodiments, when a distance between the opening portion OPA and the light transmission areas LTP is dense, the area of the overlapping area RA between the reach areas RA may be increased and the area of the effective areas TA may be reduced as shown in FIG. 14A. In addition, as the area of the effective area TA is reduced, detecting an exact shape of the fingerprint is difficult.

Conversely, when the distance between the opening portion OPA and the light transmission areas LTP is widened to reduce the area of the overlapping area between the reach areas RA, the area of an area where the reflection light does not reach between the reach areas RA is increased, and thus the exact shape of the fingerprint may be sufficiently detected.

Therefore, in various embodiments of the disclosure, the opening portions OPA and the light transmission areas LTP may be arranged in suitable shape and distance so that the reach area RA minimally overlaps between the opening portions OPA and the light transmission areas LTP and a sufficiently large effective area TA is secured.

Referring to FIG. 14C, in various embodiments of the disclosure, the opening portions OPA and the light transmission areas LTPs may be regularly arranged along the diagonal direction of the first direction DR1 and the second direction DR2. In such embodiments, six adjacent opening portions OPA and light transmission areas LTP may be arranged for any opening portions OPA and light transmission areas LTP, and adjacent opening portions OPA and light transmission areas LTP may be arranged to form a hexagon. That is, the adjacent opening portions OPA and light transmission areas LTP may be located at each vertex of the hexagon.

According to some example embodiments, the opening portions OPA and the light transmission areas LTP are arranged so as not to be spaced apart from the reflection light reach areas RA of the respective opening portions OPA and light transmission areas LTP. Then, the effective areas TA of the reflection light to the opening portions OPA and the light transmission areas LTP may have a substantially hexagonal shape.

The area where the reflection light does not reach may be minimized and the area of the effective area TA within the reach area RA may be maximized through the opening portions OPA and the light transmission areas LTP arranged as shown in FIG. 14C. Therefore, the disclosure may improve efficiency and reliability of fingerprint sensing.

Figure 15:
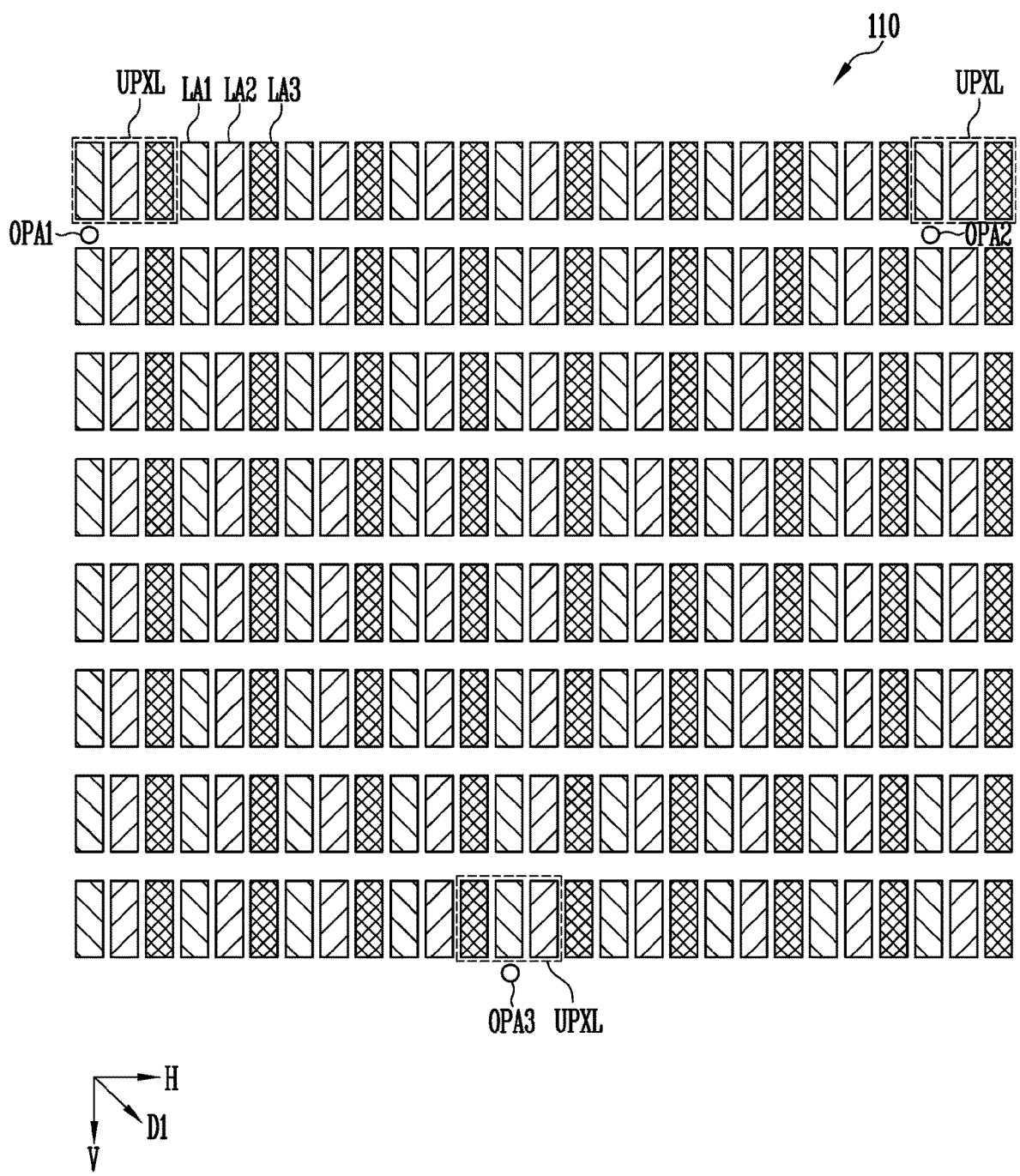
FIG. 15 illustrates a schematic plan view of a display device according to some example embodiments of the disclosure.

FIG. 15 illustrates a schematic plan view of a display device according to some example embodiments of the disclosure. Specifically, FIG. 15 illustrates an example in which the opening portions OPA are formed in the pixel definition layer 117 between the light emitting areas LA of the display panel 110 according to the disclosure.

According to some example embodiments of the disclosure, a plurality of light emitting areas LA1, LA2, and LA3 may be arranged on the display panel 110. In the illustrated embodiment, the light emitting areas LA1, LA2, and LA3 may have a rectangular shape. However, the technical spirit of the disclosure is not limited thereto, and the light emitting areas LA1, LA2, and LA3 may have various shapes such as a circle, an ellipse, a hexagon, and an octagon. The light emitting areas LA1, LA2, and LA3 may be arranged in a stripe form.

Specifically, the light emitting areas LA1, LA2, and LA3 may include first light emitting areas LA1 that emit a first color (for example, red), second light emitting areas LA2 that emit a second color (for example, green), and third light emitting areas LA3 that emit a third color (for example, blue). The first to third light emitting areas LA1, LA2, and LA3 are repeatedly arranged. For example, the first light emitting area LA1, the second light emitting area LA2, the third light emitting area LA3 may be sequentially arranged.

At this time, one first light emitting area LA1, one second light emitting area LA2, and one third light emitting area LA3 may configure one unit pixel UPXL. In the illustrated embodiment, the unit pixel UPXL is shown as being somewhat exaggerated to clearly distinguish each of the light emitting areas LA1, LA2, and LA3. An example in which the unit pixel UPXL has a rectangle is illustrated. However, in the various embodiments of the disclosure, the unit pixel UPXL may have a substantially square shape. However, the technical spirit of the disclosure is not limited thereto.

According to some example embodiments, the order of the light emitting areas LA1, LA2, and LA3 may remain the same in all rows. For example, the second light emitting area LA2 may be adjacent to the first light emitting area LA1 in a horizontal direction H, the third light emitting area LA3 may be adjacent to the second light emitting area LA2 in the horizontal direction H, and the first light emitting area LA1 may be adjacent to the third light emitting area LA3 in the horizontal direction H. The light emitting areas LA1, LA2, and LA3 may be divided by a non-light emitting area surrounding each of the light emitting areas LA1, LA2, and LA3, that is, the pixel definition layer 117 (shown in FIGS. 8 to 13).

At least one of opening portions OPA1, OPA2, or OPA3 may be formed in the pixel definition layer 117. In various embodiments of the disclosure, at least one of the opening portions OPA1, OPA2, or OPA3 may be formed at a density lower than that of the light emitting areas LA1, LA2, and LA3. For example, one of the opening portions OPA1, OPA2, and OPA3 may be arranged adjacent to some of the light emitting areas LA1, LA2, and LA3, and the opening portions OPA1, OPA2, and OPA3 may not be arranged adjacent to the remains of the light emitting areas LA1, LA2, and LA3. In other words, one of the opening portions OPA1, OPA2, and OPA3 may be arranged adjacent to some of the unit pixels UPXL, and the opening portions OPA1, OPA2, and OPA3 may not be arranged adjacent to the remains of the unit pixels UPXL. At this time, the opening portions OPA1, OPA2, and OPA3 may be arranged adjacent to the first light emitting area LA1 that emits red in one unit pixel UPXL. However, the disclosure is not limited thereto.

According to some example embodiments, at least one of the opening portions OPA1, OPA2, or OPA3 may be arranged along a diagonal direction D1 of the horizontal direction H and a vertical direction V as described with reference to FIG. 14C. That is, when the first opening portion OPA1 and the second opening portion OPA2 configure a first row of the opening portions OPA1, OPA2, and OPA3, the first opening portion OPA1 configures a first column of the opening portions OPA1, OPA2, and OPA3, and the second opening portion OPA2 configures a third column of the opening portions OPA1, OPA2, and OPA3, the third opening portion OPA3 may configure a second row of the opening portions OPA1, OPA2, and OPA3 and a second column of the opening portions OPA1, OPA2, and OPA3.

When such an arrangement is repeated, eight adjacent opening portions may be arranged with respect to any opening portions, and adjacent opening portions may be arranged to form a quadrangle. That is, the adjacent opening portions may be located at each vertex and each side of the quadrangle.

In the above-described embodiment, the opening portions OPA1, OPA2, and OPA3 may be located between the unit pixels UPXL so that the three adjacent opening portions OPA1, OPA2, and OPA3 form a substantially equilateral triangle. For example, the opening portions OPA1, OPA2, and OPA3 may be arranged one by one for every eight unit pixels UPXL in the horizontal direction H and may be arranged one by one for every seven unit pixels UPXL in the vertical direction V as shown in the drawing. Then, as described with reference to FIG. 14C, there is no separation between the reach areas RA of the reflection light to the respective opening portions OPA1, OPA2, and OPA3, and the effective areas TA may be maximized in each reach area RA.

According to some example embodiments, one opening portion OPA1, OPA2, or OPA3 and one adjacent light emitting area LA1, LA2, or LA3 may form one pixel PXL. For example, in FIG. 15, the first opening portion OPA1 and the first light emitting area LA1 may configure one pixel PXL. In such embodiments, the adjacent opening portions OPA1, OPA2, and OPA3 and light emitting areas LA1, LA2, and LA3 may correspond to the first pixel PXL1 shown in FIGS. 11 to 13. Conversely, the light emitting areas LA1, LA2, and LA3 to which the opening portions OPA1, OPA2, and OPA3 are not arranged adjacent may correspond to the pixel PXL shown in FIGS. 8 to 10.

Figure 16:
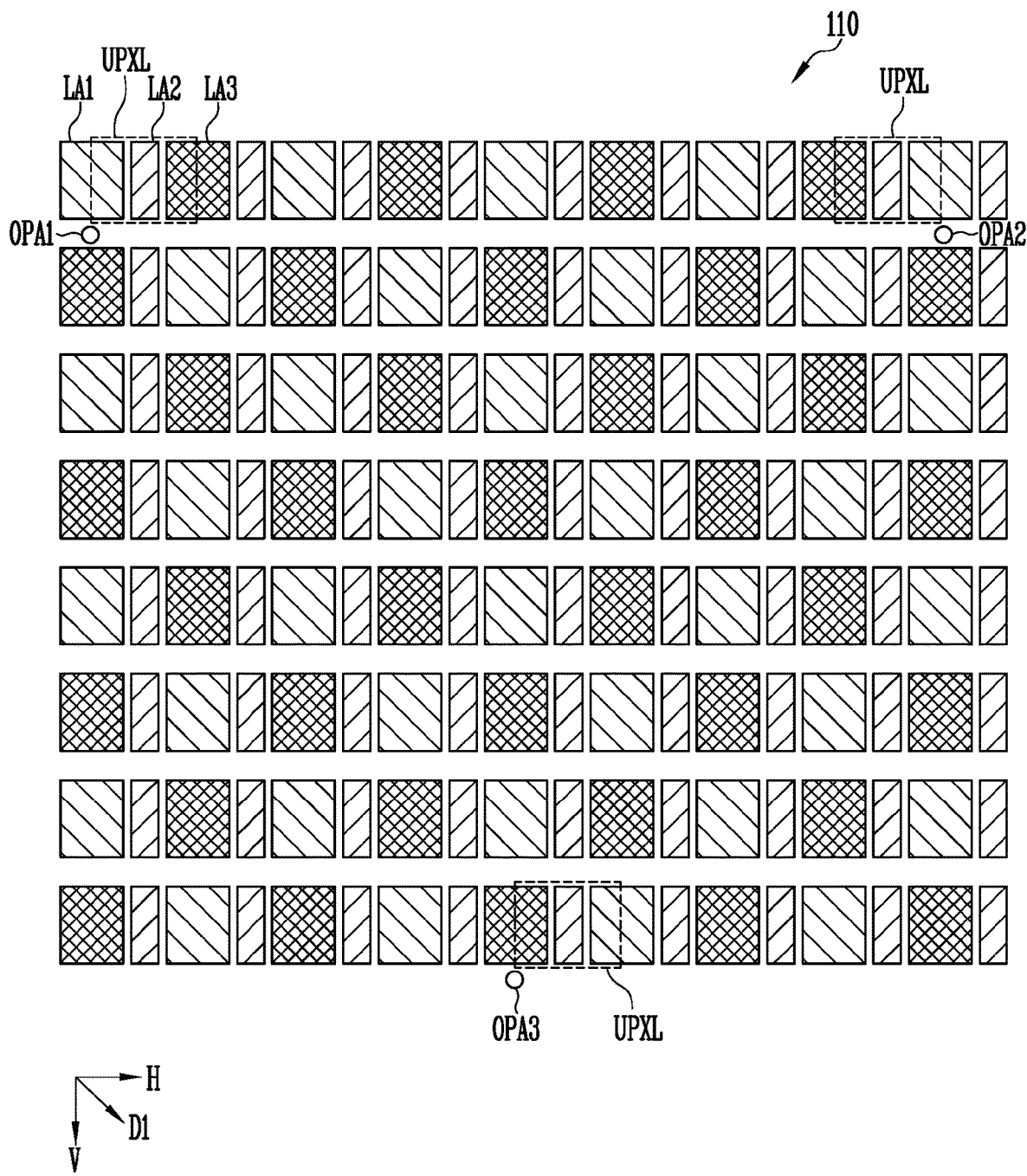
FIG. 16 illustrates a schematic plan view of a display device according to some example embodiments of the disclosure.

FIG. 16 illustrates a schematic plan view of a display device according to some example embodiments of the disclosure. FIG. 16 illustrates an example in which the opening portions OPA are formed in the pixel definition layer 117 between the light emitting areas LA of the display panel 110 according to the disclosure.

According to some example embodiments of the disclosure, a plurality of light emitting areas LA1, LA2, and LA3 may be arranged on the display panel 110. In the illustrated embodiment, the light emitting areas LA1, LA2, and LA3 may have a rectangular shape. However, the technical spirit of the disclosure is not limited thereto, and the light emitting areas LA1, LA2, and LA3 may have various shapes such as a circle, an ellipse, a hexagon, and an octagon. According to some example embodiments, the light emitting areas LA1, LA2, and LA3 may be formed so that at least some of the light emitting areas LA1, LA2, and LA3 have different areas. For example, as shown in the drawing, the second light emitting area LA2 may have an area smaller than that of the first and third light emitting areas LA1 and LA3. However, the disclosure is not limited thereto.

The light emitting areas LA1, LA2, and LA3 may be arranged in a pentile form. The light emitting areas LA1, LA2, and LA3 may include first light emitting areas LA1 that emit a first color (for example, red), second light emitting areas LA2 that emit a second color (for example, green), and third light emitting areas LA3 that emit a third color (for example, blue). The first to third light emitting areas LA1, LA2, and LA3 are repeatedly arranged. For example, the first light emitting area LA1, the second light emitting area LA2, the third light emitting area LA3 may be sequentially arranged.

At this time, one area of the first light emitting area LA1 adjacent to the second light emitting area LA2, one second light emitting area LA2, and one area of the third light emitting area LA3 adjacent to the second light emitting area LA2 may configure one unit pixel UPXL. According to some example embodiments, the unit pixel UPXL may have a substantially square shape. However, the technical spirit of the disclosure is not limited thereto.

According to some example embodiments, the order of the light emitting areas LA1, LA2, and LA3 may be changed according to a row. For example, the second light emitting area LA2 may be adjacent to the first light emitting area LA1 in the horizontal direction H and the third light emitting area LA3 may be adjacent to the first light emitting area LA1 in the vertical direction V. Specifically, as shown in FIG. 16, one first light emitting area LA1 may be arranged adjacent to two second light emitting areas LA2. The light emitting areas LA1, LA2, and LA3 may be divided by a non-light emitting area surrounding each of the light emitting areas LA1, LA2, and LA3, that is, the pixel definition layer 117 (shown in FIGS. 8 to 13).

At least one of opening portions OPA1, OPA2, or OPA3 may be formed in the pixel definition layer 117. In various embodiments of the disclosure, at least one of the opening portions OPA1, OPA2, or OPA3 may be formed at a density lower than that of the light emitting areas LA1, LA2, and LA3. For example, one of the opening portions OPA1, OPA2, and OPA3 may be arranged adjacent to some of the light emitting areas LA1, LA2, and LA3, and the opening portions OPA1, OPA2, and OPA3 may not be arranged adjacent to the remains of the light emitting areas LA1, LA2, and LA3. In other words, one of the opening portions OPA1, OPA2, and OPA3 may be arranged adjacent to some of the unit pixels UPXL, and the opening portions OPA1, OPA2, and OPA3 may not be arranged adjacent to the remains of the unit pixels UPXL. At this time, the opening portions OPA1, OPA2, and OPA3 may be arranged adjacent to the first light emitting area LA1 or the third light emitting area LA3 that emits red or blue in one unit pixel UPXL. However, the disclosure is not limited thereto.

According to some example embodiments, at least one of the opening portions OPA1, OPA2, or OPA3 may be arranged along the diagonal direction D1 of the horizontal direction H and the vertical direction V as described with reference to FIG. 14C. That is, when the first opening portion OPA1 and the second opening portion OPA2 configure a first row of the opening portions OPA1, OPA2, and OPA3, the first opening portion OPA1 configures a first column of the opening portions OPA1, OPA2, and OPA3, and the second opening portion OPA2 configures a third column of the opening portions OPA1, OPA2, and OPA3, the third opening portion OPA3 may configure a second row of the opening portions OPA1, OPA2, and OPA3 and a second column of the opening portions OPA1, OPA2, and OPA3.

When such an arrangement is repeated, eight adjacent opening portions may be arranged with respect to any opening portions, and adjacent opening portions may be arranged to form a quadrangle. That is, the adjacent opening portions may be arranged at each vertex and each side of the quadrangle.

In the above-described embodiment, the opening portions OPA1, OPA2, and OPA3 may be arranged between the unit pixels UPXL so that the three adjacent opening portions OPA1, OPA2, and OPA3 form a substantially equilateral triangle. For example, the opening portions OPA1, OPA2, and OPA3 may be arranged one by one for every eight unit pixels UPXL in the horizontal direction H and may be arranged one by one for every seven unit pixels UPXL in the vertical direction V as shown in the drawing. Then, as described with reference to FIG. 14C, there is no separation between the reach areas RA of the reflection light to the respective opening portions OPA1, OPA2, and OPA3, and the effective areas TA may be maximized in each reach area RA.

According to some example embodiments, one opening portion OPA1, OPA2, or OPA3 and one adjacent light emitting area LA1, LA2, or LA3 may form one pixel PXL. For example, in FIG. 16, the first opening portion OPA1 and the first light emitting area LA1 may configure one pixel PXL. In such embodiments, the adjacent opening portions OPA1, OPA2, and OPA3 and light emitting areas LA1, LA2, and LA3 may correspond to the first pixel PXL1 shown in FIGS. 11 to 13. Conversely, the light emitting areas LA1, LA2, and LA3 to which the opening portions OPA1, OPA2, and OPA3 are not arranged adjacent may correspond to the pixel PXL shown in FIGS. 8 to 10.

Figure 17:
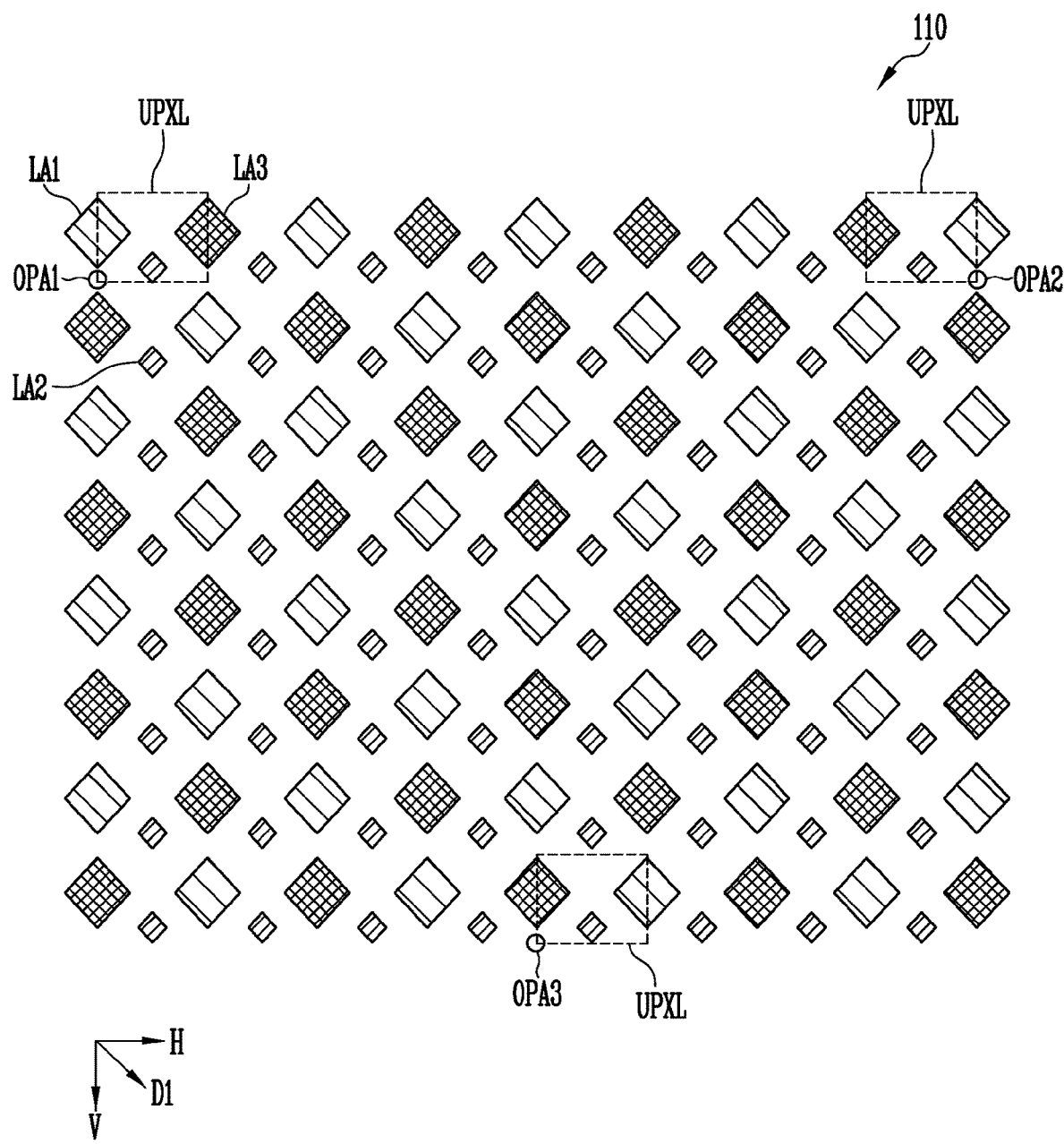
FIG. 17 illustrates a schematic plan view of a display device according to some example embodiments of the disclosure.

FIG. 17 illustrates a schematic plan view of a display device according to some example embodiments of the disclosure. FIG. 17 illustrates an example in which the opening portions OPA are formed in the pixel definition layer 117 between the light emitting areas LA of the display panel 110 according to the disclosure.

According to some example embodiments of the disclosure, a plurality of light emitting areas LA1, LA2, and LA3 may be arranged on the display panel 110. In the illustrated embodiment, the light emitting areas LA1, LA2, and LA3 may have a diamond shape. According to some example embodiments, the light emitting areas LA1, LA2, and LA3 may be formed so that at least some of the light emitting areas LA1, LA2, and LA3 have different areas. For example, as shown in the drawing, the second light emitting area LA2 may have an area smaller than that of the first and third light emitting areas LA1 and LA3. However, the disclosure is not limited thereto.

The light emitting areas LA1, LA2, and LA3 may be arranged in a pentile form. The light emitting areas LA1, LA2, and LA3 may include first light emitting areas LA1 that emit a first color (for example, red), second light emitting areas LA2 that emit a second color (for example, green), and third light emitting areas LA3 that emit a third color (for example, blue). The first to third light emitting areas LA1, LA2, and LA3 are repeatedly arranged. For example, the first light emitting area LA1, the second light emitting area LA2, the third light emitting area LA3 may be sequentially arranged.

For example, the second light emitting area LA2 may be adjacent to the first light emitting area LA1 in the diagonal direction D1 inclined to the horizontal direction H, and the third light emitting area LA3 may be adjacent to the first light emitting area LA1 in the horizontal direction H. Specifically, as shown in FIG. 17, one second light emitting area LA2 may be surrounded by two first light emitting areas LA1 and two third light emitting areas LA3. At this time, the two first light emitting areas LA1 may be arranged diagonally with each other, and the two third light emitting areas LA3 may be arranged diagonally with each other. In such embodiments, the area of the third light emitting area LA3 may be smaller than the area of the first and second light emitting areas LA1 and LA2, but the disclosure is not limited thereto.

One area of the first light emitting area LA1 adjacent to the second light emitting area LA2, one second light emitting area LA2, and one area of the third light emitting area LA3 adjacent to the second light emitting area LA2 may configure one unit pixel UPXL. According to some example embodiments, the unit pixel UPXL may have a substantially square shape. However, the technical spirit of the disclosure is not limited thereto.

The light emitting areas LA1, LA2, and LA3 may be divided by a non-light emitting area surrounding each of the light emitting areas LA1, LA2, and LA3, that is, the pixel definition layer 117 (shown in FIGS. 8 to 13). At least one of opening portions OPA1, OPA2, or OPA3 may be formed in the pixel definition layer 117.

In various embodiments of the disclosure, at least one of the opening portions OPA1, OPA2, or OPA3 may be formed at a density lower than that of the light emitting areas LA1, LA2, and LA3. For example, one of the opening portions OPA1, OPA2, and OPA3 may be arranged adjacent to some of the light emitting areas LA1, LA2, and LA3, and the opening portions OPA1, OPA2, and OPA3 may not be arranged adjacent to the remains of the light emitting areas LA1, LA2, and LA3. However, the disclosure is not limited thereto. In other words, one of the opening portions OPA1, OPA2, and OPA3 may be arranged adjacent to some of the unit pixels UPXL, and the opening portions OPA1, OPA2, and OPA3 may not be arranged adjacent to the remains of the unit pixels UPXL. At this time, the opening portions OPA1, OPA2, and OPA3 may be arranged adjacent to the first light emitting area LA1 or the third light emitting area LA3 that emits red or blue in one unit pixel UPXL. However, the disclosure is not limited thereto.

According to some example embodiments, at least one of the opening portions OPA1, OPA2, or OPA3 may be arranged along the diagonal direction D1 of the horizontal direction H and the vertical direction V as described with reference to FIG. 14C. That is, when the first opening portion OPA1 and the second opening portion OPA2 configure a first row of the opening portions OPA1, OPA2, and OPA3, the first opening portion OPA1 configures a first column of the opening portions OPA1, OPA2, and OPA3, and the second opening portion OPA2 configures a third column of the opening portions OPA1, OPA2, and OPA3, the third opening portion OPA3 may configure a second row of the opening portions OPA1, OPA2, and OPA3 and a second column of the opening portions OPA1, OPA2, and OPA3.

When such an arrangement is repeated, eight adjacent opening portions may be positioned with respect to any opening portions, and adjacent opening portions may be arranged to form a quadrangle. That is, the adjacent opening portions may be positioned at each vertex and each side of the quadrangle.

In the above-described embodiment, the opening portions OPA1, OPA2, and OPA3 may be located between the unit pixels UPXL so that the three adjacent opening portions OPA1, OPA2, and OPA3 form a substantially equilateral triangle. In other words, the opening portions OPA1, OPA2, and OPA3 may be arranged so that distances between the two adjacent opening portions have substantially similar values.

For example, the opening portions OPA1, OPA2, and OPA3 may be arranged one by one for every eight unit pixels UPXL in the horizontal direction H and may be arranged one by one for every seven unit pixels UPXL in the vertical direction V as shown in the drawing. In this case, a vertical distance L1 between the opening portions OPA1 and OPA2 adjacent in the horizontal direction H may be 356 μm, and a distance between the opening portions OPA1 and OPA3 or OPA3 and OPA2 adjacent in the diagonal direction D1 may be 358.8 μm. Since the distance L1 and the distance L2 are substantially similar, it may be seen that the adjacent opening portions OPA1, OPA2, and OPA3 are arranged in a substantially equilateral triangle.

Then, as described with reference to FIG. 14C, there is no separation between the reach areas RA of the reflection light to the respective opening portions OPA1, OPA2, and OPA3, and the effective areas TA may be maximized in each reach area RA.

According to some example embodiments, one opening portion OPA1, OPA2, or OPA3 and one adjacent light emitting area LA1, LA2, or LA3 may form one pixel PXL. For example, in FIG. 16, the first opening portion OPA1 and the first light emitting area LA1 may configure one pixel PXL. In such embodiments, the adjacent opening portions OPA1, OPA2, and OPA3 and light emitting areas LA1, LA2, and LA3 may correspond to the first pixel PXL1 shown in FIGS. 11 to 13. Conversely, the light emitting areas LA1, LA2, and LA3 to which the opening portions OPA1, OPA2, and OPA3 are not arranged adjacent may correspond to the pixel PXL shown in FIGS. 8 to 10.

It will be understood by those skilled in the art that the disclosure may be carried out in other specific forms without changing the technical spirit or essential characteristics thereof. Therefore, it should be understood that the above-described embodiments are illustrative and not restrictive in all aspects. The scope of the disclosure is defined by the following claims rather than the above detailed description, and it is intended that all changes and modifications drawn from the meaning and range of the claims and the equivalents thereof are included within the scope of the disclosure.

What is claimed is:

1. A fingerprint sensor comprising:
a substrate;
a circuit element layer on a first surface of the substrate and including a plurality of conductive layers;
a light emitting element layer on the circuit element layer and including light emitting elements and a pixel definition layer partitioning light emitting areas; and
a light sensor layer on a second surface of the substrate and including light sensors,
wherein the pixel definition layer includes a light shielding material, and covers portions of first electrodes of the light emitting elements, and
wherein the pixel definition layer includes first opening portions exposing the first electrodes, and second opening portions exposing a portion of the circuit element layer,
wherein the light emitting element layer comprises:
the first electrodes on the circuit element layer, wherein the first electrodes are exposed by the first opening portions to form the light emitting areas;
a plurality of light emitting layers on the exposed first electrodes; and
a second electrode on the pixel definition layer to cover the light emitting layers, and
wherein each of the second opening portions is formed adjacent to at least a portion of the light emitting areas.

2. The fingerprint sensor according to claim 1, wherein the circuit element layer includes a light transmission hole of which at least a portion overlaps the second opening portions.

3. The fingerprint sensor according to claim 2, wherein the second opening portions are arranged along a diagonal direction with respect to a first direction along which the light emitting areas are arranged or with respect to a second direction perpendicular to the first direction.

4. The fingerprint sensor according to claim 3, wherein distances between adjacent two second opening portions are equal to each other.

5. The fingerprint sensor according to claim 3, wherein the light emitting areas comprises:
a first light emitting area configured to emit a first color;
a second light emitting area configured to emit a second color; and
a third light emitting area configured to emit a third color.

6. The fingerprint sensor according to claim 5, wherein the first color is red, the second color is green, and the third color is blue, and
wherein the second opening portions are arranged adjacent to at least one of the first light emitting area or the third light emitting area.

7. The fingerprint sensor according to claim 5, wherein the light emitting areas comprise unit pixels including the first light emitting area, the second light emitting area, and the third light emitting area, and
the second opening portions are arranged adjacent to at least a part of the unit pixels.

8. The fingerprint sensor according to claim 7, wherein the second opening portions are at intervals of eight unit pixels in the first direction and at intervals of seven unit pixels in the second direction.

9. The fingerprint sensor according to claim 7, wherein the unit pixels include the first light emitting area, the second light emitting area, and the third light emitting area which are arranged sequentially, and
the second opening portions are arranged adjacent to the first light emitting area of at least a part of the unit pixels.

10. The fingerprint sensor according to claim 7, wherein the unit pixels comprise:
first unit pixels in which the first light emitting area and the second light emitting area are arranged sequentially; and
second unit pixels in which the third light emitting area and the second light emitting area are arranged sequentially, and
wherein the first unit pixels and the second unit pixels are alternately arranged.

11. The fingerprint sensor according to claim 10, wherein the second opening portions are adjacent to the first light emitting area of at least a part of the first unit pixels and the third light emitting area of at least a part of the second unit pixels.

12. The fingerprint sensor according to claim 11, wherein a first one of two second opening portions adjacent in the diagonal direction is adjacent to one of the first unit pixels and a second one of the two second opening portions is adjacent to one of the second unit pixels.

13. The fingerprint sensor according to claim 2, wherein the circuit element layer comprises:
a semiconductor layer on the substrate and including at least one active pattern;
a first conductive layer on at least one active pattern and including at least one gate electrode;
a second conductive layer on the first conductive layer and including at least one capacitor electrode; and
a third conductive layer on the second conductive layer and including at least one wire, and
at least one insulating layer is between the first conductive layer, at least one insulating layer is between the second conductive layer, and at least one insulating layer is between the third conductive layer.

14. The fingerprint sensor according to claim 13, wherein the light transmission hole is formed to overlap each other in at least two of the semiconductor layer, the first conductive layer, the second conductive layer, and the third conductive layer.

15. The fingerprint sensor according to claim 2, wherein the second opening portions and the light transmission hole guide light incident from an outside to the light sensors.

16. A display device comprising:
a display panel comprising:
a substrate;
a circuit element layer on a first surface of the substrate and including a plurality of conductive layers; and
a light emitting element layer on the circuit element layer and including light emitting elements and a pixel definition layer partitioning light emitting areas; and
a light sensor layer on a second surface of the substrate and including a plurality of light sensors,
wherein the pixel definition layer includes a light shielding material, and covers portions of first electrodes of the light emitting elements, and
wherein the pixel definition layer includes contact holes first opening portions exposing the first electrodes, and second opening portions exposing a portion of the circuit element layer,
wherein the light emitting element layer comprises:
the first electrodes on the circuit element layer and exposed by the first opening portions to form the light emitting areas;

a plurality of light emitting layers on the exposed first electrodes; and a second electrode on the pixel definition layer to cover the light emitting layers, and wherein each of the second opening portions is adjacent to at least a portion of the light emitting areas.

17. The display device according to claim 16, wherein the circuit element layer includes a light transmission hole of which at least a portion overlaps the second opening portions.

18. The display device according to claim 17, wherein the circuit element layer comprises:

a semiconductor layer on the substrate and including at least one active pattern;

a first conductive layer on at least one active pattern and including at least one gate electrode;

a second conductive layer on the first conductive layer and including at least one capacitor electrode; and a third conductive layer on the second conductive layer and including at least one wire, at least one insulating layer between the first conductive layer, at least one insulating layer between the second conductive layer, and at least one insulating layer between the third conductive layer, and the light transmission hole is formed to overlap each other in at least two of the semiconductor layer, the first conductive layer, the second conductive layer, and the third conductive layer.

19. The display device according to claim 16, wherein the second opening portions are arranged along a diagonal direction with respect to a first direction along which the light emitting areas are arranged or with respect to a second direction perpendicular to the first direction.

20. The display device according to claim 19, wherein distances between adjacent two second opening portions are equal to each other.

* * * * *